(12) United States Patent
Nakashiba et al.

(10) Patent No.: US 12,525,570 B2
(45) Date of Patent: Jan. 13, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventors: Yasutaka Nakashiba, Tokyo (JP); Toshiyuki Hata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 447 days.

(21) Appl. No.: 18/311,561

(22) Filed: May 3, 2023

(65) Prior Publication Data

US 2024/0371817 A1 Nov. 7, 2024

(51) Int. Cl.
*H01L 23/00* (2006.01)
*H01L 21/683* (2006.01)
(Continued)

(52) U.S. Cl.
CPC .......... *H01L 24/48* (2013.01); *H01L 21/6836* (2013.01); *H01L 23/3142* (2013.01); *H01L 23/49513* (2013.01); *H01L 23/4952* (2013.01); *H01L 23/49551* (2013.01); *H01L 23/49562* (2013.01); *H01L 24/83* (2013.01); *H01L 2221/68327* (2013.01); *H01L 2224/48247* (2013.01); *H01L 2224/83874* (2013.01); *H01L 2924/13091* (2013.01)

(58) Field of Classification Search
CPC ........... H01L 21/6836; H01L 23/49513; H01L 23/3142; H01L 23/4952; H01L 23/49551; H01L 23/49562; H01L 23/3107; H01L 23/49575; H01L 24/48; H01L 24/83; H01L 24/29; H01L 24/32; H01L 24/45; H01L 24/49; H01L 24/85; H01L 24/13; H01L 2221/68328; H01L 2224/48247; H01L 2224/83874; H01L 2924/13091
See application file for complete search history.

(56) References Cited

U.S. PATENT DOCUMENTS 6,239,496 B1 * 5/2001 Asada ................. H01L 21/6836
257/E21.503
9,147,647 B2 9/2015 Kaneda
(Continued)

FOREIGN PATENT DOCUMENTS

JP 2014-093431 A 5/2014

*Primary Examiner* — Mohsen Ahmadi
(74) *Attorney, Agent, or Firm* — Rimon P.C.

(57) ABSTRACT

A semiconductor device includes: a first semiconductor chip mounted on a chip mounting portion via a first bonding material; and a second semiconductor chip mounted on the first semiconductor chip via a second bonding material. The first semiconductor chip includes: a protective film; and a first pad electrode exposed from the protective film in a first opening portion of the protective film. The second semiconductor chip is mounted on the first pad electrode of the first semiconductor chip via the second bonding material. The second bonding material includes: a first member being in contact with the first pad electrode; and a second member interposed between the first member and the second semiconductor chip. The first member is a conductive bonding material of a film shape, and the second member is an insulating bonding material of a film shape.

15 Claims, 38 Drawing Sheets

(51) Int. Cl.
*H01L 23/31* (2006.01)
*H01L 23/495* (2006.01)

(56) References Cited

U.S. PATENT DOCUMENTS

| | | | | |
|---|---|---|---|---|
| 2006/0006508 | A1* | 1/2006 | Mitsuhashi | H01L 23/4951 257/676 |
| 2013/0256916 | A1* | 10/2013 | Kwon | H01L 23/488 257/777 |
| 2015/0028472 | A1* | 1/2015 | Jung | H01L 25/0657 257/737 |
| 2016/0086870 | A1* | 3/2016 | Abe | H01L 24/49 257/712 |
| 2016/0204082 | A1* | 7/2016 | Sugiyama | H01L 25/50 257/621 |
| 2017/0221800 | A1* | 8/2017 | Nishikizawa | H01L 24/83 |
| 2020/0158673 | A1* | 5/2020 | Nakane | H10H 20/854 |

* cited by examiner

SEMICONDUCTOR DEVICE AND METHOD OF MANUFACTURING THE SAME

BACKGROUND

The present disclosure relates to a semiconductor device, and can be suitably used, for example, for a semiconductor device and method of manufacturing the same having two stacked semiconductor chips.

A semiconductor package is manufactured by mounting a semiconductor chip on a die pad, electrically connecting a pad of the semiconductor chip with a lead via a wire, and sealing them with resin.

Here, there are disclosed techniques listed below.
[Patent Document 1] Japanese Unexamined Patent Application Publication No. 2014-93431

Patent Document 1 discloses a semiconductor package in which another semiconductor chip is mounted on a semiconductor chip mounted on a die pad.

SUMMARY

It is desirable to improve the performance of a semiconductor device having two stacked semiconductor chips. Other objects and novel features will become apparent from the description of this specification and the accompanying drawings.

According to an embodiment, a semiconductor device includes: a first semiconductor chip mounted on a chip mounting portion via a first bonding material; and a second semiconductor chip mounted on the first semiconductor chip via a second bonding material. The first semiconductor chip includes: a protective film; and a first pad electrode exposed from the protective film in a first opening portion of the protective film. The second semiconductor chip is mounted on the first pad electrode of the first semiconductor chip via the second bonding material. The second bonding material includes: a first member being in contact with the first pad electrode; and a second member interposed between the first member and the second semiconductor chip. The first member is a conductive bonding material of a film shape, and the second member is an insulating bonding material of a film shape.

DETAILED DESCRIPTION

Figure 1:
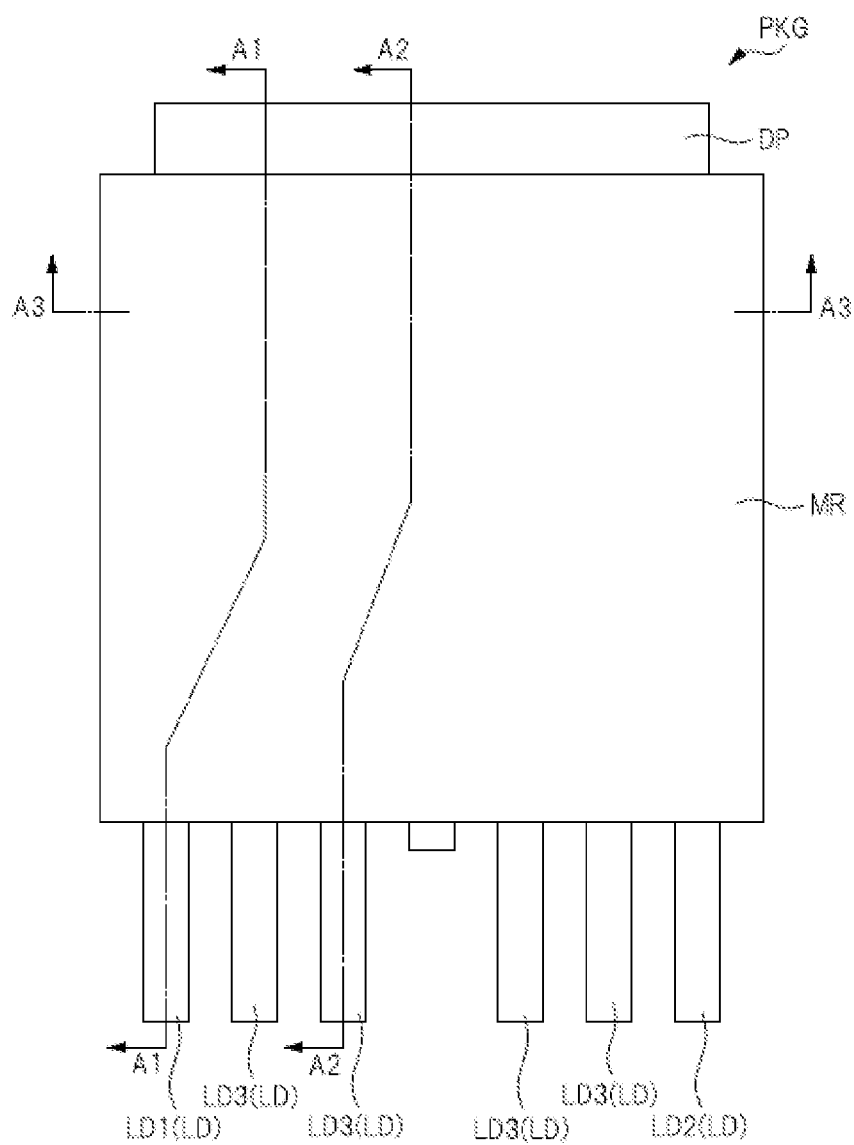
FIG. 1 is an upper surface view of a semiconductor device according to a first embodiment.

In the following embodiments, when required for convenience, the description will be made by dividing into a plurality of sections or embodiments, but except when specifically stated, they are not independent of each other, and one is related to the modified example, detail, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle.

Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

The details of the embodiments will be described based on drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted even in the case of cross-sectional view in order to make the drawings easier to see. Also, even in the case of a plan view, hatching may be used to make the drawing easier to see.

Further, in the present application, the field-effect transistor is described as MOSFET (Metal Oxide Semiconductor Field Effect Transistor), but it includes not only the case where an oxide film is used as the gate insulating film but also the case where an insulating film other than the oxide film is used as the gate insulating film.

First Embodiment

<Structure of Semiconductor Device>

Figure 2:
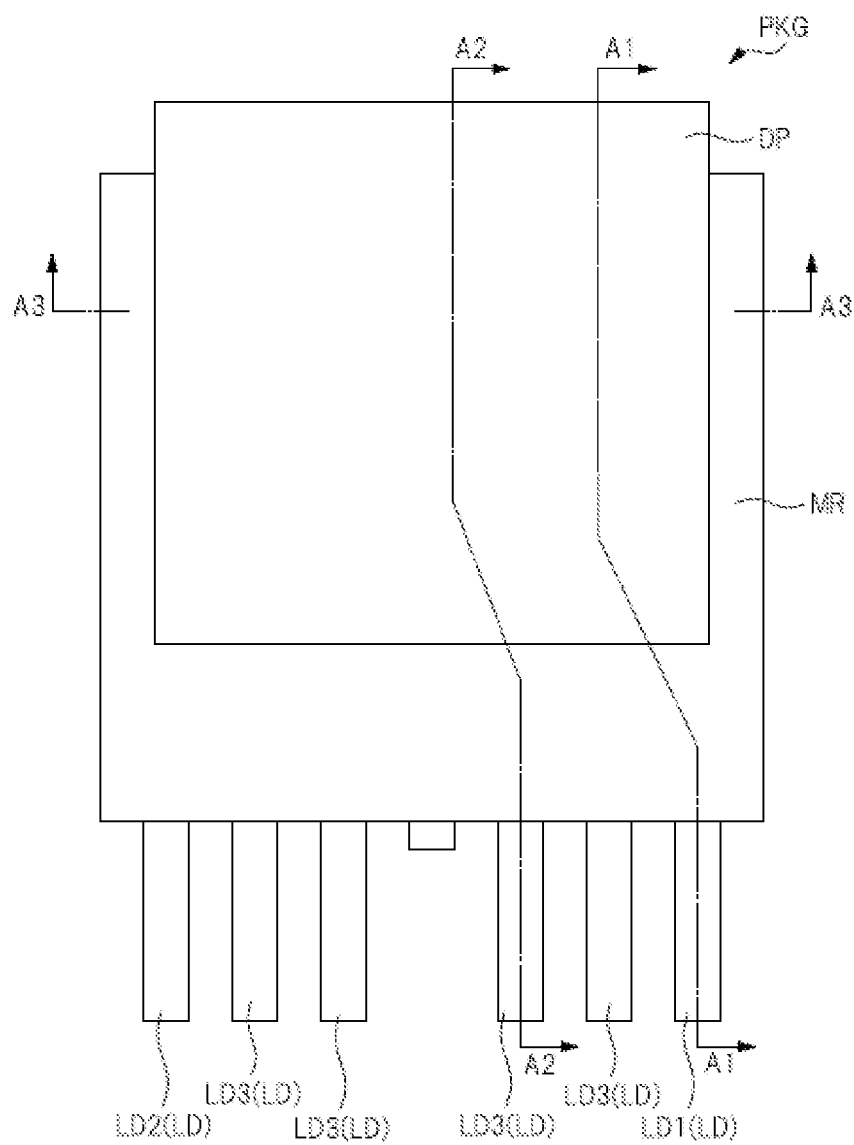
FIG. 2 is a lower surface view of the semiconductor device according to the first embodiment.
Figure 3:
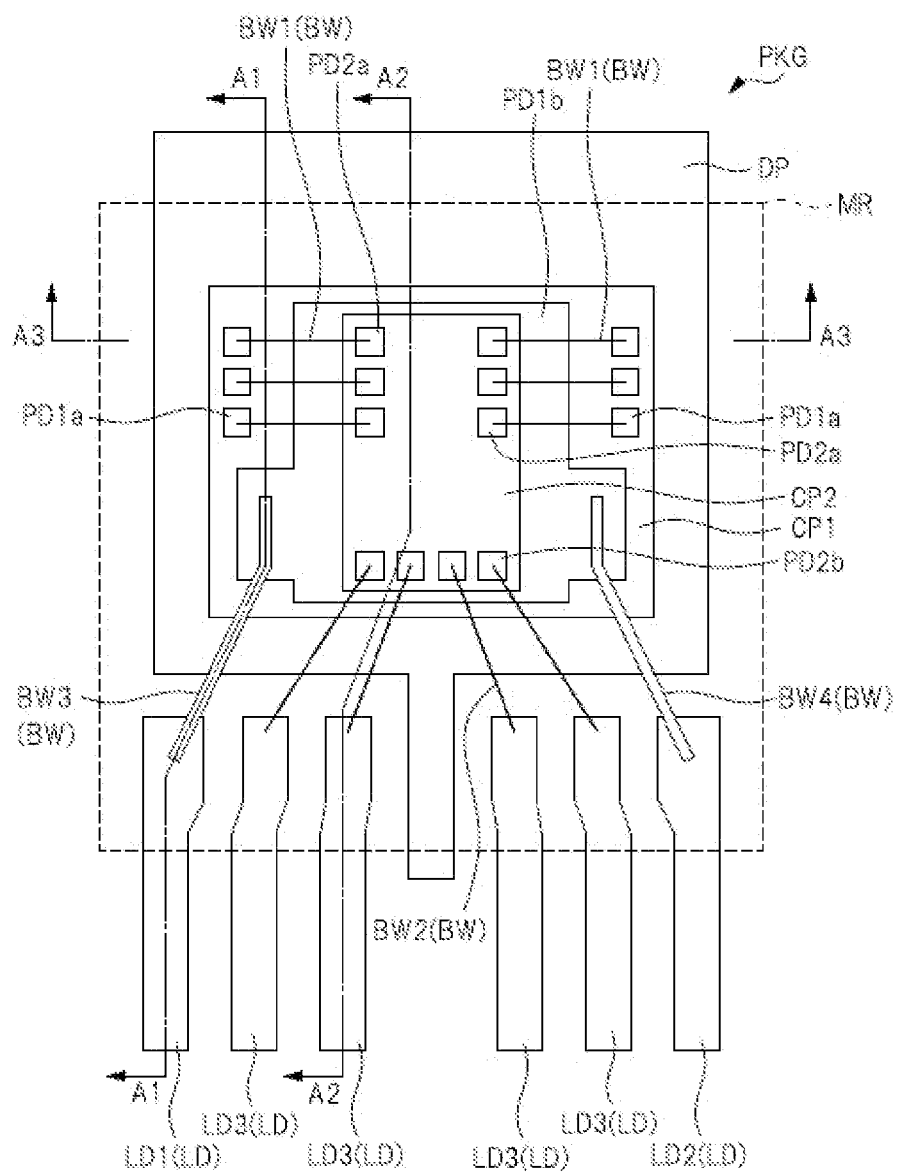
FIG. 3 is a perspective plan view of the semiconductor device according to the first embodiment.
Figure 4:
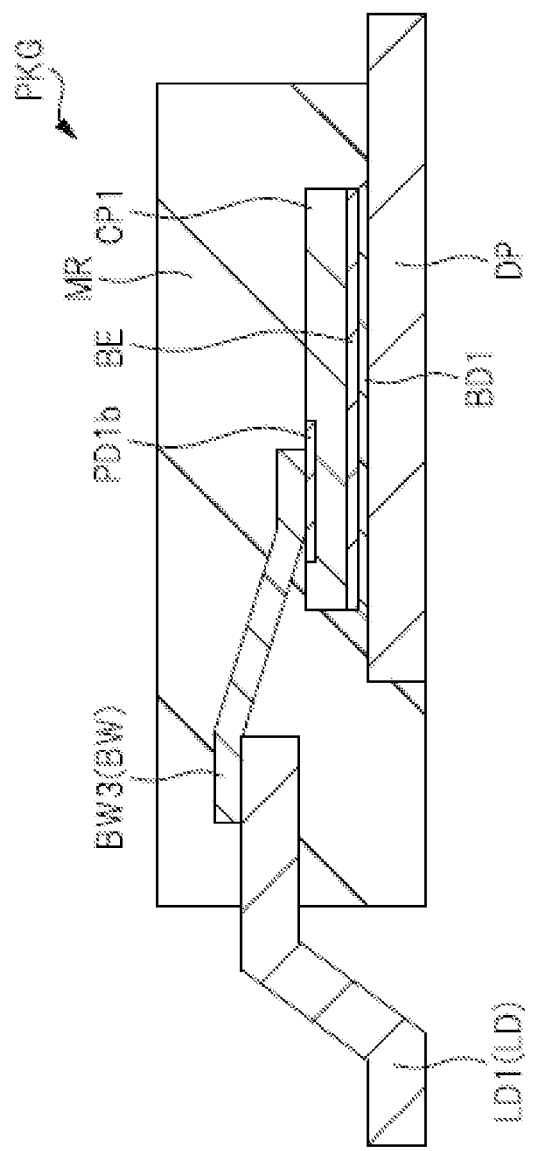
FIG. 4 is a cross-sectional view of the semiconductor device according to the first embodiment.
Figure 5:
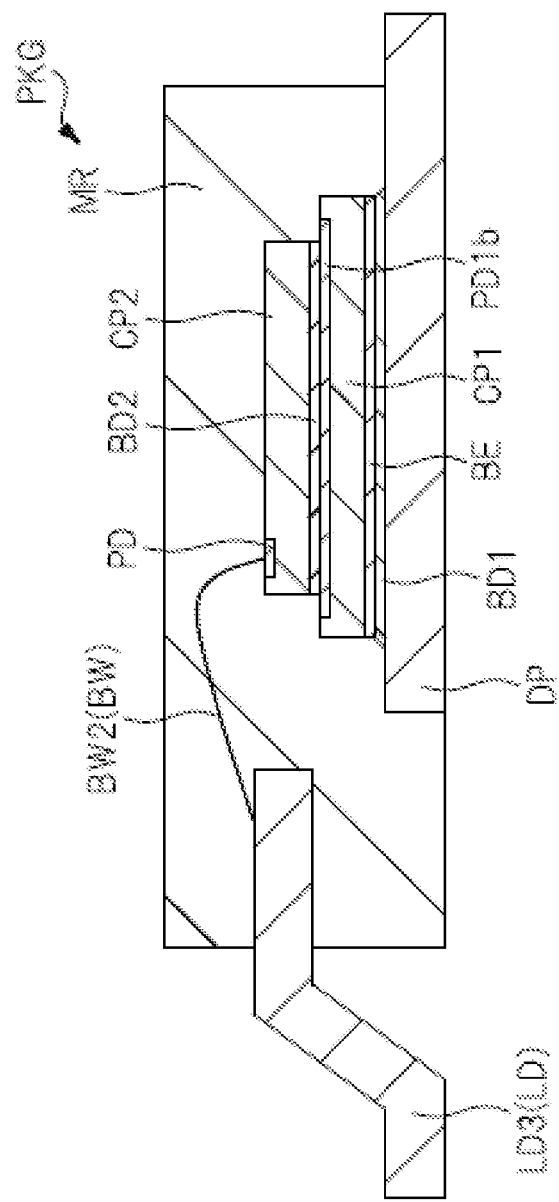
FIG. 5 is a cross-sectional view of the semiconductor device according to the first embodiment.
Figure 6:
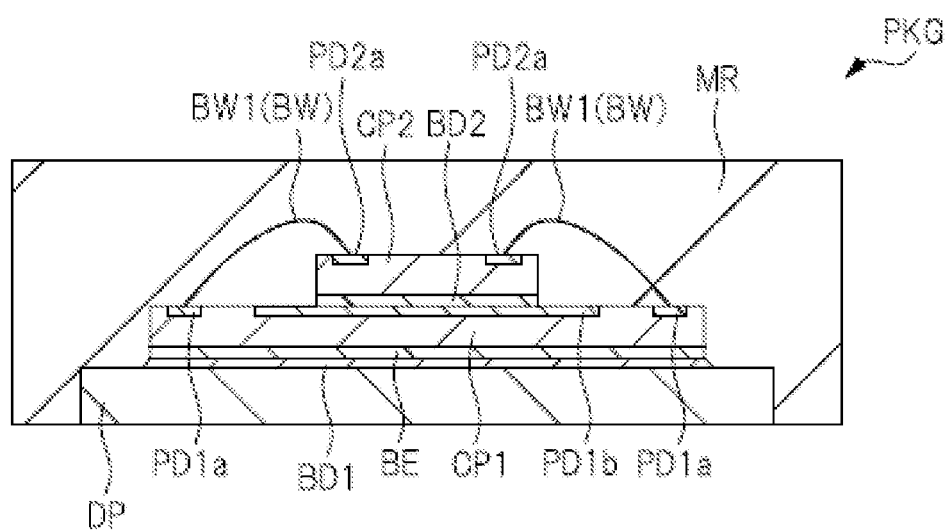
FIG. 6 is a cross-sectional view of the semiconductor device according to the first embodiment.
Figure 7:
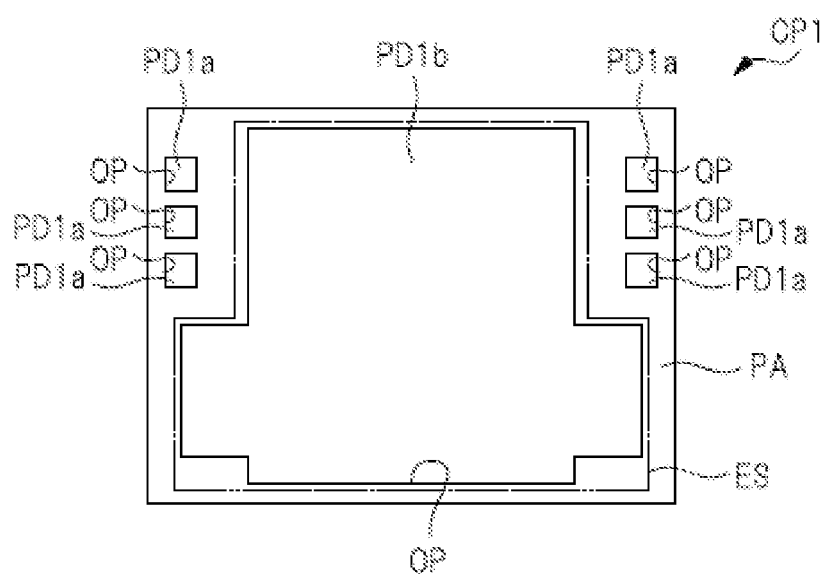
FIG. 7 is an upper surface view of a semiconductor chip used in the semiconductor device according to the first embodiment.
Figure 8:
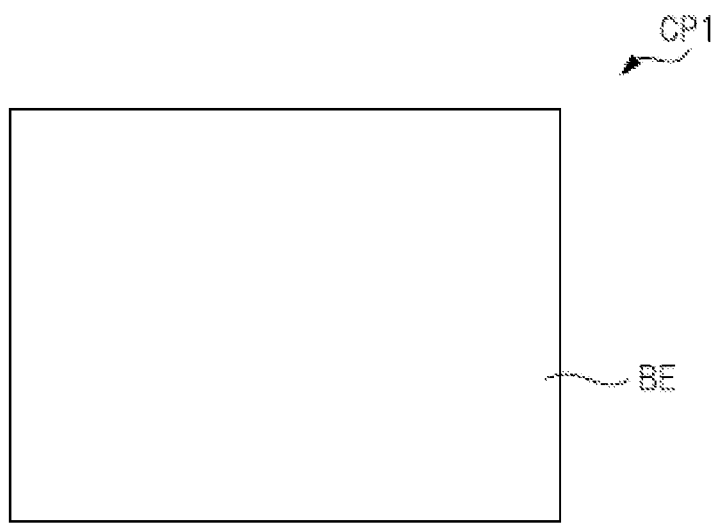
FIG. 8 is a lower surface view of the semiconductor chip used in the semiconductor device according to the first embodiment.
Figure 9:
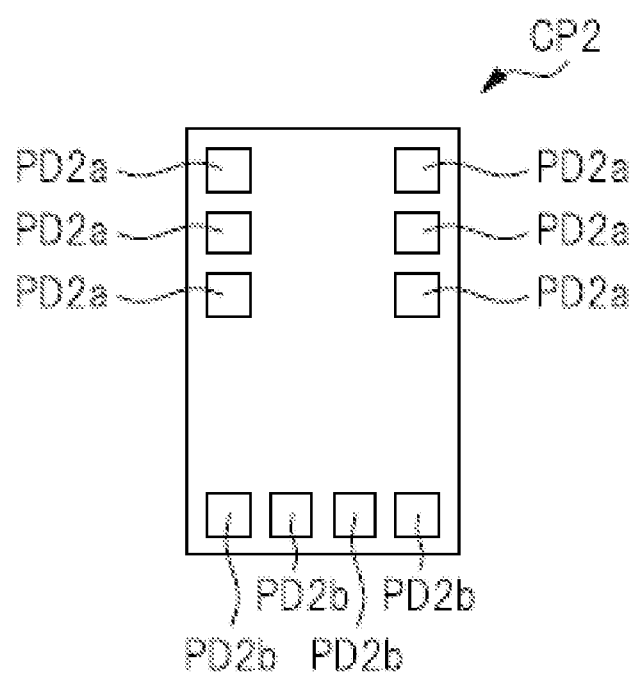
FIG. 9 is an upper surface view of a semiconductor chip used in the semiconductor device according to the first embodiment.

The structure of the semiconductor device of the present embodiment will be described by referring to FIG. 1 to FIG. 9. FIG. 1 is an upper surface view of a semiconductor device PKG according to the present embodiment, and FIG. 2 is a lower surface view (rear surface view) of the semiconductor device PKG according to the present embodiment. FIG. 3 is a perspective plan view of the semiconductor device PKG according to the present embodiment, and shows a perspective plan view of the semiconductor device PKG on the upper surface side of the semiconductor device PKG seen through a sealing portion MR. FIG. 4 to FIG. 6 are a cross-sectional view of the semiconductor device according to the present embodiment. The cross-sectional view at the position of A1-A1 line in FIGS. 1 to 3 corresponds to FIG. 4, the cross-sectional view at the position of A2-A2 line in FIGS. 1 to 3 corresponds to FIG. 5, and the cross-sectional view at the position of A3-A3 line in FIGS. 1 to 3 corresponds to FIG. 6. FIG. 7 is an upper surface view of a semiconductor chip used in the semiconductor device PKG according to the present embodiment, FIG. 8 is a lower surface view (rear surface view) of the semiconductor chip used in the semiconductor device PKG according to the present embodiment, and FIG. 9 is an upper surface view of a semiconductor chip used semiconductor device PKG according to the present embodiment.

The semiconductor device PKG shown in FIGS. 1 to 6 is a semiconductor package including a semiconductor chip CP1 incorporating a switching-power MOSFET and a semiconductor chip CP2 for controlling the semiconductor chip CP1.

The semiconductor device PKG has a die pad (chip mounting portion) DP, a semiconductor chip CP1 mounted on upper surface (main surface) of the die pad DP, a semiconductor chip CP2 mounted on the semiconductor chip CP1, a plurality of lead LD, a plurality of bonding wires (hereinafter simply referred to as wires), and a sealing portion (sealing resin portion, sealing member) MR for sealing them.

The sealing portion MR is made of, for example, a resin material such as a thermosetting resin material, and may include fillers and the like. For example, the sealing portion MR can be formed using a filler-containing epoxy-resin or the like.

The die pad DP and the plurality of lead LD are made of an electrical conductor, and are preferably made of a metallic material such as copper (Cu) or a copper alloy. Each of the plurality of lead LD is partially sealed in the sealing portion MR, and other part thereof protrudes from the side surface of the sealing portion MR to the outside of the sealing portion MR. Hereinafter, a portion of the lead LD located in the sealing portion MR is referred to as an inner lead portion, and a portion of the lead LD located outside the sealing portion MR is referred to as an outer lead portion.

Note that the semiconductor device PKG according to the present embodiment has a configuration in which a part of each lead LD (outer lead portion) protrudes from the side surface of the sealing portion MR, and will be described below based on this structure, but the structure is not limited to this structure, and for example, a structure in which each lead LD hardly protrudes from the side surface of the sealing portion MR and a part of each lead LD is exposed on the lower surface of the sealing portion MR may be adopted.

A plurality of pad electrodes (hereinafter, simply referred to as pads) PD1a, PD1b are formed on the front surface of the semiconductor chip CP1, and a back surface electrode BE is formed on the back surface of the semiconductor chip CP1.

The semiconductor chip CP1 is mounted and bonded on upper surface of the die pad DP via a conductive bonding material BD1 in a direction in which the front surface faces upward and the back surface electrode BE faces upper surface of the die pad DP. That is, the back electrode BE of the semiconductor chip CP1 is bonded to upper surface of the die pad DP via the conductive bonding material BD1. Therefore, the back electrode BE of the semiconductor chip CP1 is electrically connected to the die pad DP via the conductive bonding material BD1.

In the semiconductor chip CP2, the surface of the semiconductor chip CP2 faces upward, and the back surface of the semiconductor chip CP2 faces the surface of the semiconductor chip CP1, and is mounted and bonded on the semiconductor chip CP1 (specifically, on the pad PD1b of the semiconductor chip CP1) via a bonding material BD2. A plurality of pad PD2a, PD2b are formed on the surface of the semiconductor chip CP2. The back surface of the semiconductor-chip CP2 is not formed. The bonding material BD2 will be described later. The plurality of lead LD included in the semiconductor device PKG includes a lead LD1, LD2, LD3. The plurality of wire BW included in the semiconductor device PKG includes a wire BW1, BW2, BW3, BW4. The diameter of each wire BW3, BW4 is greater than the diameter of each wire BW1, BW2. That is, the wire BW3, BW4 is thicker than the wire BW1, BW2. Each of the wire BW1, BW2, BW3, BW4 is made of a metal, for example, the wire BW1, BW2 is made of gold (Au), and the wire BW3, BW4 is made of aluminum (Al) or an aluminum alloy.

A plurality of pads PD1a of the semiconductor chip CP1 and a plurality of pads PD2a of the semiconductor chip CP2 are electrically connected to each other via a plurality of wires BW1.

The pad PD2b of the semiconductor chip CP2 and the plurality of lead LD3 are electrically connected to each other via a plurality of wire BW2. That is, one end portion of both ends of each wire BW2 is connected to each pad PD2b of the semiconductor chip CP2, and the other end portion is connected to each lead LD2 (inner lead portion).

The pad PD1b of the semiconductor chip CP1 and the lead LD1 are electrically connected via a wire BW3, and the pad PD1b of the semiconductor chip CP1 and the lead LD2 are electrically connected via a wire BW4.

The planar shape of the sealing portion MR is substantially rectangular and has four sides, and in the cases of FIGS. 1 to 3, a plurality of lead LD (LD1, LD2, LD3) are arranged on one side thereof. The die pad DP and the plurality of lead LD are separated from each other, and a part of the sealing portion MR is interposed therebetween.

The semiconductor chip CP1, CP2 and the plurality of wires BW (BW1, BW2, BW3, BW4) are sealed in the sealing portion MR and are not exposed from the sealing portion MR. On the other hand, the die pad DP is sealed in the sealing portion MR except the lower surface, but the lower surface of the die pad DP is exposed from the lower surface of the sealing portion MR.

The outer lead portions of the plurality of lead LD protrude from the side surface of the sealing portion MR to the outside of the sealing portion MR. The outer lead portions of the respective lead LD are bent so that a lower surface near an end portion of the outer lead portion is positioned on substantially the same plane as a lower surface of the sealing portion MR. The outer lead portion of the lead LD functions as an external connecting terminal portion (external terminal) of semiconductor device PKG. The lower surface of the die pad DP exposed at the lower surface of the sealing portion MR can also function as an external terminal of semiconductor device PKG.

<Structure of Semiconductor Chip Cp1>

Figure 10:
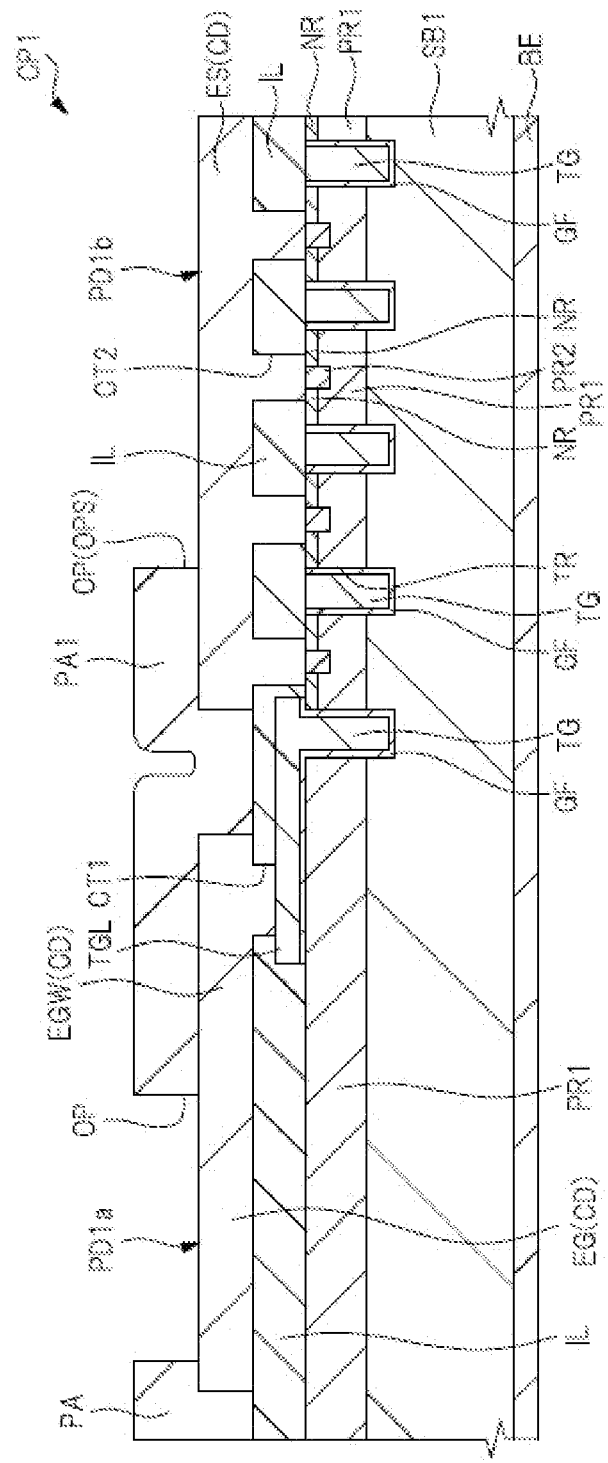
FIG. 10 is a cross-sectional view of the semiconductor chip at a main portion used in the semiconductor device according to the first embodiment.

Next, referring to FIG. 10, the structure of the semiconductor chip CP1 will be described. FIG. 10 is a cross-sectional view of the semiconductor chip CP1. In FIG. 7, the source electrode ES (the outer peripheral position of the source electrode ES) shown in FIG. 10 is indicated by a two-dot chain line. The outer periphery of the source electrode ES indicated by the two-dot chain line is covered with a protective film PA1.

The semiconductor chip CP1 is a semiconductor chip in which a power MOSFET is formed, and a power MOSFET is formed in a semiconductor substrate SB1 composing the semiconductor chip CP1. In the semiconductor chip CP2, a control circuit for controlling the semiconductor chip CP1 (power MOSFET in the semiconductor chip CP1) is formed.

As shown in FIG. 10, semiconductor substrate SB1 is made of, for example, an n-type monocrystalline silicon into which an n-type impurity such as arsenic (As) is introduced. As semiconductor substrate SB1, a so-called epitaxial wafer can also be used.

A plurality of unit transistor cells composing a power MOSFET is formed in the semiconductor substrate SB1, and the power MOSFET is formed by coupling the plurality of unit transistor cells in parallel to each other. The unit transistor cells have the same structure as each other. Each unit transistor cell is formed of, for example, an n-channel typed MOSFET having a trench gate structure.

The semiconductor substrate SB1 functions as a drain area of the unit transistor cell. On the back surface of semiconductor substrate SB1 (that is, on the back surface of CP1), a back electrode BE for draining is formed. Therefore, the back electrode BE can function as a drain electrode electrically connected to the drain of the power MOSFET. The back-electrode BE is formed on the entire back surface of semiconductor substrate SB1, and thus on the entire back surface of CP1.

The p-type semiconductor region (p-type body region) PR1 formed in semiconductor substrate SB1 functions as a channel-forming region of the unit transistor cell. Further, the $n^+$-type semiconductor region NR formed on the p-type semiconductor region PR1 functions as a source region of the unit transistor cell. Therefore, the $n^+$-type semiconductor region NR is a semiconductor region for source of the power MOSFET.

A trench TR extending in a thickness direction of the semiconductor substrate SB1 from the main surface of the semiconductor substrate SB1 is formed in the semiconductor substrate SB1. The trench TR is formed so as to penetrate through the $n^+$-type semiconductor region NR and the p-type semiconductor region PR1 from the upper surface of the $n^+$-type semiconductor region NR, and is terminated in the semiconductor substrate SB1. According to another aspect, the p-type semiconductor region PR1 is formed between adjacent trenches TR, and the $n^+$-type semiconductor region NR for source is formed at the position that is above the p-type semiconductor region PR1 and that is adjacent to the trench TR.

A gate insulating film GF made of silicon oxide or the like is formed on the bottom surface and the side surface of the trench TR. Further, a trench gate electrode TG is buried in the trench TR via the gate insulating film GF. The trench gate electrode TG is formed of, for example, a polycrystalline silicon film into which an n-type impurity (e.g., phosphorus) is introduced. The trench gate electrode TG functions as a gate (gate electrode) of the unit transistor cell.

Further, on the semiconductor substrate SB1, a gate lead-out wiring portion TG made of a conductive film of the same layer as the trench gate electrode TG is formed, and the trench gate electrode TGL and the gate lead-out wiring portion TGL are integrally formed and electrically connected to each other. Note that the trench gate electrode TG is buried in the trench TR, while the interconnect portion TGL for the gate lead-out extends not in the trench TR but on semiconductor substrate SB1. The wiring portion TGL for the gate lead-out is electrically connected to the gate wiring EGW through a contact hole CT1 formed in the insulating film IL covering the wiring portion. The gate-line EGW extends along the outer periphery of the main surface of the semiconductor chip CP1. The gate electrode EG is an electrode portion for forming a pad PD1$a$ for a gate of the power MOSFET. The gate electrode EG and the gate wiring EGW are integrally formed, and the width of the gate electrode EG is larger than the width of the gate wiring EGW. The gate electrode EG is electrically connected to the plurality of trench gate electrodes TG formed in semiconductor substrate SB1 via the gate wiring EGW and the wiring portion TGL for gate lead-out.

The source electrode ES is electrically connected to $n^+$-type semiconductor region NR for the source through a contact hole CT2 formed in the insulating film IL on semiconductor substrate SB1. Further, the is source electrode ES electrically connected to the p-type semiconductor region PR1 for forming channels through $n^+$-type semiconductor region NR and electrically connected to $p^+$-type semiconductor region PR2 formed between the upper portion of the p-type semiconductor region PR1. In a plan view, the source electrode ES is formed over the entire area in which the plurality of unit-transistor cells composing the power MOSFET are formed. Therefore, in a plan view, the source electrode ES is formed on most of the main surface of the semiconductor chip CP1.

The gate electrode EG, the gate line EGW, and the source electrode ES are formed by forming a conductive film CD so as to fill the contact hole CT1, CT2 on the insulating film IL on which the contact hole CT1, CT2 is formed, and patterning the conductive film CD. That is, the gate electrode EG, the gate line EGW, and the source electrode ES are formed of a patterned conductive film CD. The conductive film CD is made of a metallic film, preferably an aluminum film or an aluminum-alloy film. Therefore, the gate electrode EG, the gate wiring EGW, and the source electrode are separated from each other except that the gate electrode EG and the gate wiring EGW are integrally formed, although they are made of the conductive film CD of the same layer.

The conductive film CD (the gate electrode EG, the gate line EGW, and the source electrode ES) is covered with an insulating protective film (an insulating film, a passivation film) PA1. That is, the protective film PA1 is formed on the insulating film IL so as to cover the conductive film CD (the gate electrode EG, the gate line EGW, and the source electrode ES). The protective film PA1 is a film located in the uppermost layer of the insulating film of the semiconductor chip CP1. More specifically, the protective film PA1 is made of an insulating film, but is preferably made of a resin film (single layer) such as a polyimide resin. As another example of the protective film PA1, a laminated film (a plurality of layers) of an inorganic insulating film (for example, silicon oxide) and an organic insulating film (for example, a resin film such as polyimide resin) formed on the inorganic insulating film may be used.

A plurality of opening portions OP are formed in the protective film PA1, and a part of the conductive film CD is exposed in each opening portion OP. The conductive film CD exposed from the protective film PAL in the opening portion OP serves as a pad PD1$a$, PD1$b$. That is, each of the pad PD1$a$, PD1$b$ is formed of the conductive film CD exposed in the opening portion OP.

The pad PD1$b$ is formed by the source electrode PA1 exposed from the protective film OP (the opening portion OP provided on the source electrode ES) of the protective film PA1. Thus, the pad PD1$b$ is a pad for sourcing the power MOSFET. The pad PD1$b$ is electrically connected to a source region ($n^+$-type semiconductor region NR) of a plurality of unit transistor cells formed in semiconductor substrate SB1 through the source electrode ES.

Here, the opening portion OP that exposes the pad PD1$b$ is referred to as an opening portion OPS with a reference numeral "OPS". Since the source electrode ES exposed from the protective film PA1 in the opening portion OPS of the protective film PA1 is the pad PD1$b$. The planar shape, the planar dimension (planar area) and the planar position of the opening portion OPS substantially coincide with the planar shape, the planar dimension (planar area) and the planar position of the pad PD1$b$, respectively.

The plurality of pads CP1 of the semiconductor chip PD1$a$ include a power MOSFET gate pad PD1$a$, and the gate pad PD1$a$ is formed by the gate electrode EG exposed from the protective film PA1 in the opening portion OP of the protective film PA1 (the opening portion OP provided on the gate electrode EG). The conductive film CD is covered with the protective film PA1 except for the portion serving as the pad PD1$a$, PD1$b$.

In addition, the plurality of pad PD1$a$ included in the semiconductor chip CP1 include a pad for an anode and a pad for a cathode for a temperature-sensing diode, as needed. Temperature-sensing diodes may be formed in semiconductor substrate SB1 or on semiconductor substrate SB1. In addition, the plurality of pad PD1$a$ included in the semiconductor chip CP1 include, as needed, a pad for sourcing the current detection MOSFET. The current sensing MOSFET may be formed in a semiconductor substrate SB1. In addition, the plurality of pad PD1$a$ included in the semiconductor chip CP1 include Kelvin pads for detecting voltages as needed. The pad for the anode and the pad for the cathode for the diode for temperature detection, the pad for the source for MOSFET for current detection, and the Kelvin pad are also formed by the conductive film CD exposed from the protective film PA1 in the opening portion OP of the protective film PA1.

A plating layer can be formed on the surface of each pad PD1$a$, PD1$b$, but preferably no plating layer is formed on the surface of each pad PD1$a$, PD1$b$ in the present embodiment. The bonding material BD2 used for mounting the semiconductor chip CP2 on the pad PD1$b$ of the semiconductor chip CP1 has a conductive bonding material (bonding film) BD2$b$. When the semiconductor chip CP2 is mounted on the pad PD1$b$ of the semiconductor chip CP1, the conductive bonding material BD2$b$ comes into contact with the conductive film CD composing the pad PD1$b$.

The trench gate electrodes TG of the plurality of unit transistor cells composing the power MOSFET are electrically connected to each other through a wiring portion TGL for gate extraction, a gate wiring EGW, and a gate electrode EG.

Therefore, the gate voltage is supplied from the pad PD1$a$ for the gate to the gate of the power MOSFET (the trench gate electrode TG of the plurality of unit transistor cells composing the power MOSFET) through the gate interconnect EGW and the interconnect portion TGL.

The drain regions of the plurality of unit transistor cells composing the power MOSFET are electrically connected to each other through the semiconductor substrate SB1 and the back electrode BE. Therefore, a drain voltage (for example, a power supply potential) is supplied from the die pad DP to the back electrode BE of the semiconductor chip CP1 via the conductive bonding material BD1, and the drain voltage is supplied from the back electrode BE to the drain region of the power MOSFET (the drain region of the plurality of unit transistor cells composing the power MOSFET).

The source regions ($n^+$-type semiconductor regions NR) of the plurality of unit transistor cells composing the power MOSFET are electrically connected with the source electrode ES and are electrically connected with each other through the source electrode ES. The pad PD1b for the source of the power MOSFET is connected to loads external to semiconductor device PKG or the like through the wire BW3, BW4 and the lead LD2, LD3.

In the semiconductor chip CP1 having such a configuration, the operating current of the unit transistor of the power MOSFET flows between semiconductor substrate SB1 for the drain and $n^+$-type semiconductor area NR for the source along the side surface of the trench gate electrode TG (that is, the side surface of the trench TR) in the thickness direction of semiconductor substrate SB1. In other words, the channels are formed along the thickness of the semiconductor chip CP1.

As described above, the semiconductor chip CP1 is a semiconductor chip in which a vertical MOSFET having a trench gate structure is formed, and the power MOSFET is formed by the trench gate type MOSFET. Here, the vertical MOSFET corresponds to a MOSFET in which a current between the source/drain flows in a thickness direction of semiconductor substrate (SB1) (a direction substantially perpendicular to a main surface of semiconductor substrate).

<Stacked Structure of Semiconductor Chips Cp1, Cp2>

As described above, the semiconductor device PKG according to the present embodiment includes a semiconductor chip CP1 and a semiconductor chip CP2 mounted on the semiconductor chip CP1. Referring to FIG. 11 to FIG. 15, a laminate structure configuration of a semiconductor chip CP1, CP2 will be described.

Figure 11:
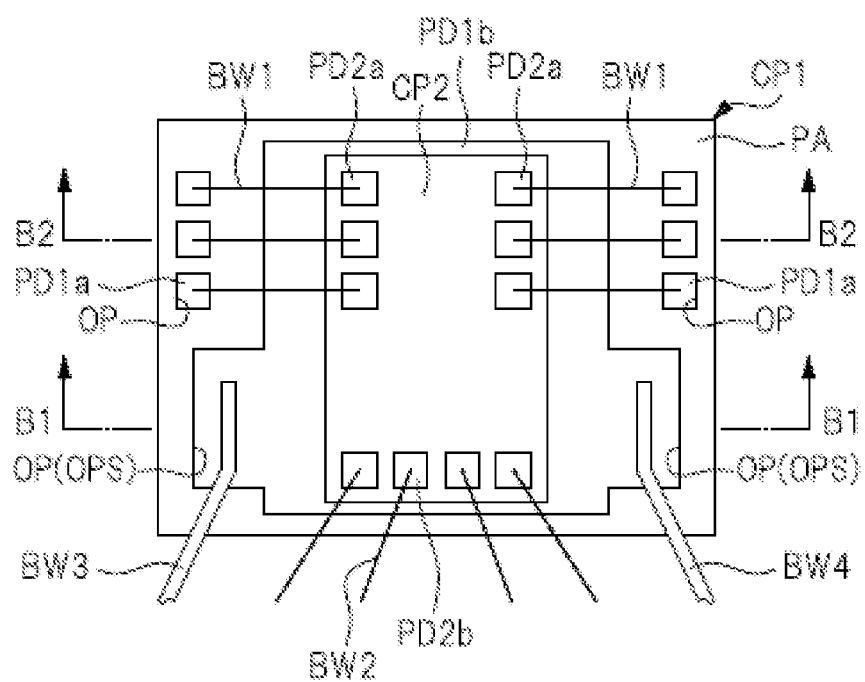
FIG. 11 is a plan view showing the two semiconductor chips in the semiconductor device according to the first embodiment.
Figure 12:
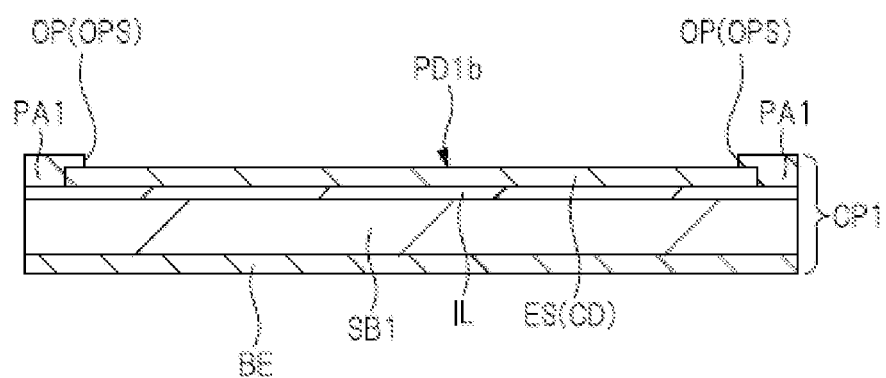
FIG. 12 is a cross-sectional view of the semiconductor chip used in the semiconductor device according to the first embodiment.
Figure 13:
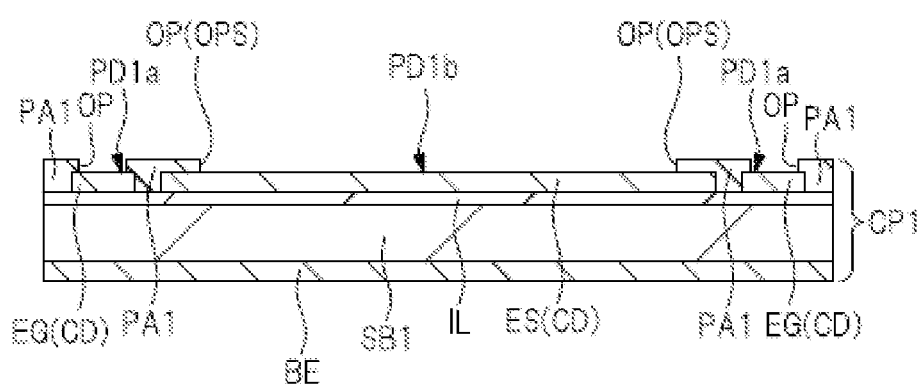
FIG. 13 is a cross-sectional view of the semiconductor chip used in the semiconductor device according to the first embodiment.
Figure 14:
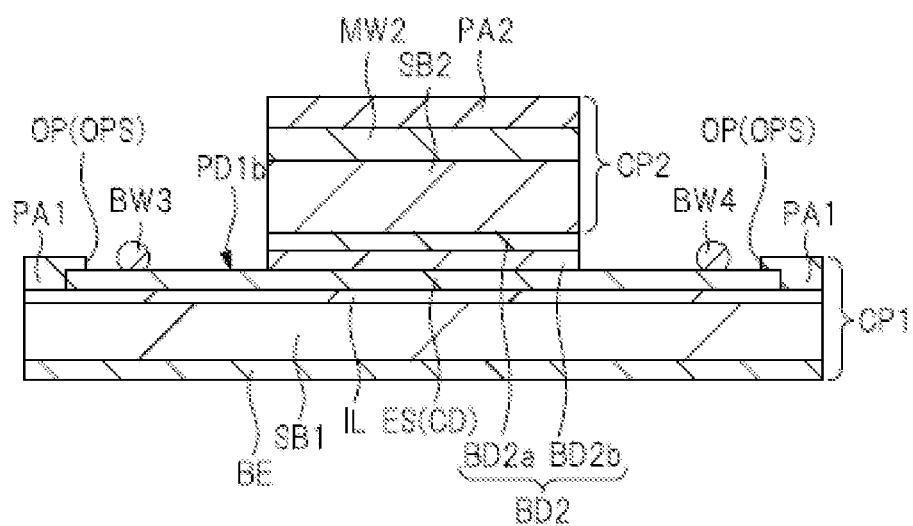
FIG. 14 is a cross-sectional view of the two semiconductor chips in the semiconductor device according to the first embodiment.
Figure 15:
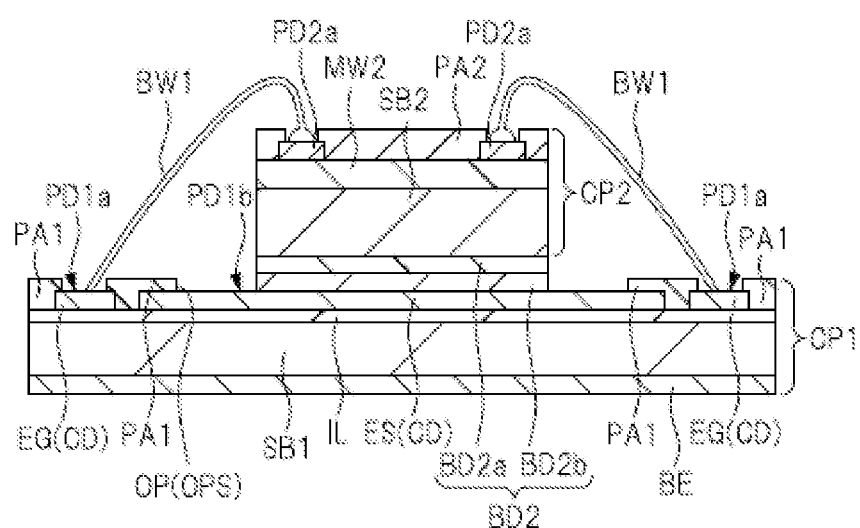
FIG. 15 is a cross-sectional view of the two semiconductor chips in the semiconductor device according to the first embodiment.

FIG. 11 is a plan view showing each semiconductor chip CP1, CP2 in the semiconductor device PKG. FIG. 12 and FIG. 13 are a cross-sectional view of the semiconductor chip CP1 at a stage prior to mounting the semiconductor chip CP2 on the semiconductor chip CP1. FIG. 14 and FIG. 15 are a cross-sectional view of each semiconductor chip CP1, CP2 in the semiconductor device PKG. FIG. 12 corresponds to cross-sectional view of the semiconductor chip CP1 at the position of B1-B1 line in FIG. 11, and FIG. 13 corresponds to cross-sectional view of the semiconductor chip CP1 at the position of B2-B2 line in FIG. 11. Further, FIG. 14 corresponds to B1-B1 line position of the semiconductor chip CP1, CP2 of FIG. 11, and FIG. 15 corresponds to cross-sectional view of the semiconductor chip CP1, CP2 at B2-B2 line position of FIG. 11. In FIG. 14 and FIG. 15, the die pad DP and the sealing portion MR are not shown.

As shown in FIGS. 14 and 15, the semiconductor chip CP2 includes a semiconductor substrate SB2, a multi-layer interconnect structure MW2 formed thereon, and a protective film PA2 formed thereon. The multi-layer interconnect structure MW2 includes a plurality of interlayer insulating films and a plurality of wiring layers. The protective film PA2 is a film located in the uppermost layer of the insulating film of the semiconductor chip CP2. More specifically, the protective film PA2 is made of an insulating film, but is preferably made of a resin film (single layer) such as a polyimide resin. As another example of the protective film PA2, a laminated film (a plurality of layers) of an inorganic insulating film (for example, silicon oxide) and an organic insulating film (for example, a resin film such as polyimide resin) formed on the inorganic insulating film may be used. A plurality of semiconductor elements (not shown) such as a transistor is formed in the semiconductor substrate SB2 composing the semiconductor chip CP2. The pad PD2a, PD2b of the semiconductor chip CP2 is formed in the uppermost wiring layer among the plurality of wiring layers composing the multilayer wiring structural MW2, and is exposed from the opening portion of the protective film PA2. The wire BW is connected to the pad PD2a, PD2b exposed from the opening portion of the protective film PA2.

As shown in FIGS. 10, 12, and 13, no plating layers are formed on the respective PD1a, PD1b of the semiconductor chip CP1. Therefore, the pad PD1a of the semiconductor chip CP1 and the pad CP2 of the semiconductor chip PD2a are directly connected to the pad BW1. That is, the wire BW1 contacts upper surface of the pad PD1a. Therefore, one end of both ends of each wire BW1 is connected to each pad PD1a of the semiconductor chip CP1, and the other end is connected to each pad PD2a of the semiconductor chip CP2.

Further, a wire BW3 for electrically connecting the pad PD1b and the lead LD1 of the semiconductor chip CP1 and a wire BW4 for electrically connecting the pad PD1b and the lead LD2 of the semiconductor chip CP1 are directly connected to the pad PD1b. That is, the wire BW3 and the wire BW4 are contacting upper surface of the pad PD1b. Therefore, one end of both ends of the wire BW3 is connected to the pad PD1b of the semiconductor chip CP1, and the other end is connected to the lead LD3 (inner lead portion). In addition, one end portion of both end portions of the wire BW4 is connected to the pad PD1b of the semiconductor chip CP1, and the other end portion thereof is connected to the lead LD4 (inner lead portion).

In the pad PD1b of the semiconductor chip CP1, the wire BW3 and the wire BW4 are respectively connected to a portion not covered with the semiconductor chip CP2. Specifically, in a plan view, a connection point (connection position) of the wire BW3 in the pad PD1b and a connection point (connection position) of the wire BW4 in the pad PD1b are positioned opposite to each other with the semiconductor chip CP2 interposed therebetween. That is, in a plan view, between the connection point (connection position) of the wire BW3 in the pad PD1b and the connection point (connection position) of the wire BW4 in the pad PD1b, the semiconductor chip CP2 is arranged.

Although the semiconductor chip CP2 is mounted on the semiconductor chip CP1, specifically, the semiconductor chip CP2 is mounted on the pad PD1b of the semiconductor chip CP1 via a bonding material BD2 (refer to FIGS. 14 and 15). In a plan view, the semiconductor chip CP2 overlaps with the pad OD1b of the semiconductor chip CP1, and is included in the pad PD1b of the semiconductor chip CP1 (refer to FIGS. 3 and 11). From another viewpoint, in a plan view, the semiconductor chip CP2 is included in the opening portion OPS of the protective film PA1. The planar dimension (planar area) of the semiconductor chip CP2 is smaller than the planar dimension (planar area) of the pad PDb (opening portion OPS). Further, in a plan view, the semiconductor chip CP2 does not overlap with the pad PD1a of the semiconductor chip CP1. Therefore, the pad PD1a of the semiconductor chip CP1 is not covered by the semiconductor chip CP2. That is, the bonding material BD2 is not in contact with the protective film PA1.

Here, the plan view corresponds to a view seen in a plane substantially parallel to the main surface of the semiconductor chip CP1 or the main surface of semiconductor substrate SB1 composing the semiconductor chip CP1.

The bonding material BD2 is made of a DAF (Die Attach Film) material, but has a laminated structure (see FIGS. 14 and 15). Specifically, the bonding material BD2 is comprised of a laminated structure of a bonding material (bonding film, DAF, member, conductive bonding material) BD2*b* having a conductive property and a bonding material (bonding film, DAF, member, insulating bonding material) BD2*a* having an insulation property on the bonding material BD2*b*. Each of the bonding materials BD2*a*, BD2*b* is a bonding material (bonding film material) of a film shape. The conductive bonding material BD2*b* is the lowermost layer of the bonding material BD2 and is in contact with the pad PD1*b* (source electrode ES) of the semiconductor chip CP1. The insulating bonding material BD2*a* is interposed between the semiconductor chip CP2 and the conductive bonding material BD2*b*, and is in contact with the back surface of the semiconductor chip CP2. Therefore, the semiconductor chip CP2 and the conductive bonding material BD2*b* are electrically insulated from each other by the insulating bonding material BD2*a*.

Since the conductive bonding material BD2*b* included in the bonding material BD2 is in contact with the pad PD1*b* (source electrode ES) of the semiconductor chip CP1, the conductive bonding material BD2*b* is electrically connected to the pad PD1*b* of the semiconductor chip CP1. However, the bonding material BD2 also includes the insulating bonding material BD2*a*, and the insulating bonding material BD2*a* is interposed between the back surface of the semiconductor chip CP2 and the conductive bonding material BD2*b*. Namely, since the insulating bonding material BD2*a* is interposed between the back surface of the semiconductor chip CP2 and the pad PD1*b* of the semiconductor chip CP1, the back surface of the semiconductor chip CP2 is electrically insulated from the pad PD1*b* (source electrode ES) of the semiconductor chip CP1. The insulating bonding material BD2*a* can prevent a short circuit between the semiconductor chip CP2 and the pad PD1*b* of the semiconductor chip CP1.

The planar dimension (planar area) and the planar shape of the bonding material BD2 are substantially the same as the planar dimension (planar area) and the planar shape of the semiconductor chip CP1, respectively. The planar dimension (planar area) and the planar shape of the insulating bonding material BD2*a* are substantially the same as the planar dimension (planar area) and the planar shape of the conductive bonding material BD2*b*, respectively.

<Manufacturing Process of Semiconductor Device>

The manufacturing process of the semiconductor device PKG according to the present embodiment will be described.

First, a lead frame having a lead LD1, LD2, LD3 and a die pad DP and a semiconductor chip CP1, CP2 are prepared. The step of preparing the lead frame, the step of preparing the semiconductor chip CP1, and the step of preparing the semiconductor chip CP2 may be performed in any order or may be performed simultaneously.

Next, a die bonding step of the semiconductor chip CP1 is performed. In the die bonding step of the semiconductor chip CP1, the semiconductor chip CP1 is mounted on the die pad DP via the conductive bonding material BD1 and bonded. The bonding material BD1 is made of silver paste, solder, or the like.

Next, a die bonding step of the semiconductor chip CP2 is performed. In the die bonding process of the semiconductor chip CP2, the semiconductor chip CP2 is mounted on the semiconductor chip CP1 via a bonding material BD2. At this time, the semiconductor chip CP2 is mounted on and bonded to the pad PD1*b* of the semiconductor chip CP1 via the bonding material BD2 such that the back surface of the semiconductor chip CP2 faces the semiconductor chip CP1. The details of the die bonding step of the semiconductor chip CP2 will be described later.

Next, a wire bonding step is performed. Thus, the plurality of pads PD1*a* of the semiconductor chip CP1 and the plurality of pads PD2*a* of the semiconductor chip CP2 are electrically connected to each other via the plurality of wires BW1, and the plurality of pads PD2*b* of the semiconductor chip CP2 and the plurality of lead LD3 are electrically connected to each other via the plurality of wires BW2. Further, the pad PD1*b* of the semiconductor chip CP1 and the lead LD1 are electrically connected via a wire BW3, and the pad PD1*b* of the semiconductor chip CP1 and the lead LD2 are electrically connected via a wire BW4.

Next, a molding process is performed to form a sealing portion MR.

Next, the lead LD1, LD2, LD3 is cut from the frame of the lead frame.

Next, the lead LD1, LD2, LD3 is bent.

In this way, the semiconductor device PKG according to the present embodiment can be produced.

<Dicing Step and DI Bonding Step>

Figure 16:
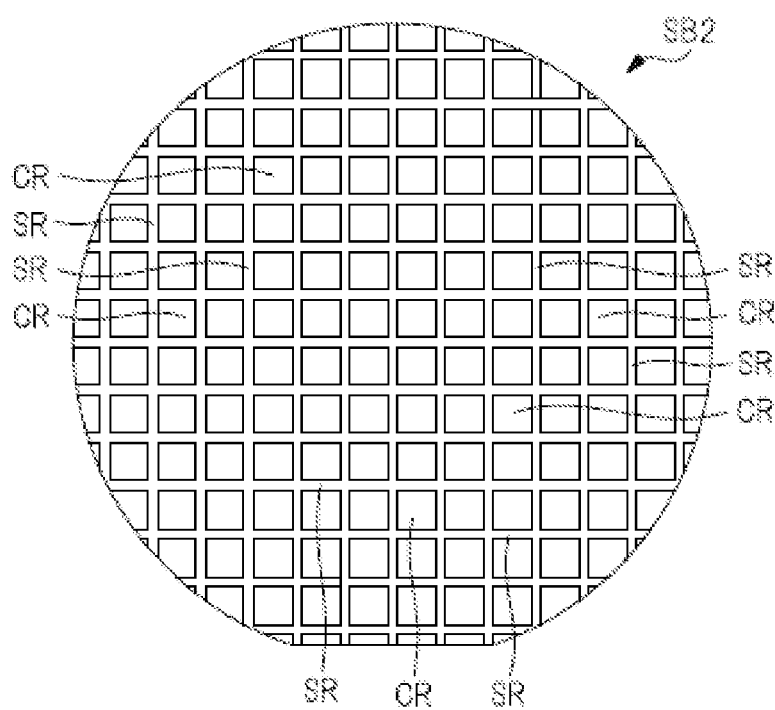
FIG. 16 is a plan view of a semiconductor substrate for manufacturing the semiconductor chip.
Figure 17:
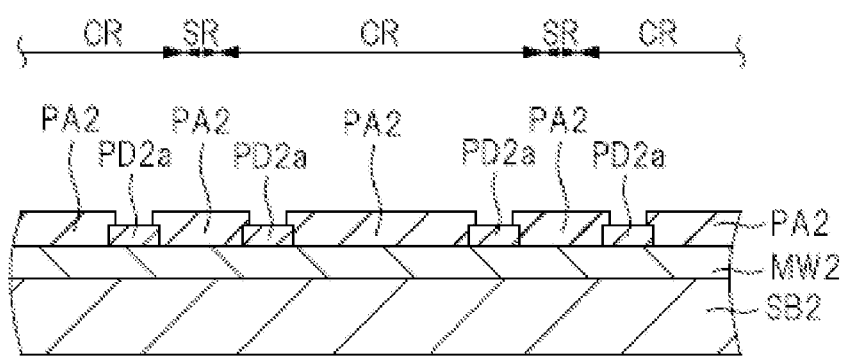
FIG. 17 is a cross-sectional view of the semiconductor substrate at a main portion to which a wafer process is performed.
Figure 18:
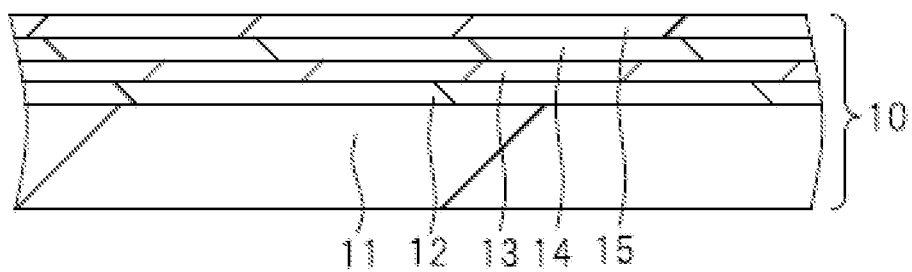
FIG. 18 is a cross-sectional view of a dicing tape at a main portion used in the first embodiment.

In order to perform the die bonding step of the semiconductor chip CP2, the semiconductor chip CP2 needs to be obtained by dicing the semiconductor substrate in which a wafer process is performed. The dicing step and the die bonding step of the semiconductor chip CP2 will be described by referring to FIG. 16 to FIG. 22. FIG. 16 is a plan view of a semiconductor substrate (semiconductor SB2 wafer) for manufacturing the semiconductor chip CP2. FIG. 17 is a cross-sectional view of the semiconductor substrate SB2 at a main portion to which a wafer process is performed. FIG. 18 is a cross-sectional view of a dicing tape 10 at a main portion used in the first embodiment. FIG. 19 to FIG. 22 are an explanatory view of a dicing step and a die bonding step, and a cross section corresponding to FIG. 18 is shown.

As shown in FIG. 16, a semiconductor substrate (semiconductor wafer) SB2 made of monocrystalline silicon or the like is prepared, and semiconductor substrate SB2 is subjected to wafer processing. At this stage, semiconductor substrate SB2 is a semiconductor wafer having a substantially circular shape in plan view.

The semiconductor substrate SB2 has a plurality of chip forming regions (semiconductor chip region) CR, which are a region from which a semiconductor chip is to be obtained, and a scribe region (cutting region) SR between the plurality of chip forming regions CR, and each chip forming region CR is surrounded by the scribe region SR in a plan view. In other words, in the semiconductor substrate SB2, the plurality of chip forming regions CR is arranged in an array, and a region between the chip forming regions CR arranged in an array corresponds to the scribe region SR. In a dicing step (cutting step) to be described later, the semiconductor substrate SB2 is cut (diced) along the scribe region SR, such that each of the chip forming regions CR is singulated to form the semiconductor chip CP2.

FIG. 17 shows main portion cross-sectional view of the wafer processed semiconductor substrate SB2. The wafer process includes a step of forming a semiconductor device such as a transistor on a semiconductor substrate SB2, a step of forming a multi-layer wiring structure MW2 on a semiconductor substrate SB2, and a step of forming a protective film PA2 on the multi-layer wiring structure MW2. Semiconductor substrate SB2 has a main surface and a back surface opposed to the main surface, and the multi-layer interconnect MW2 is formed on the main surface of semiconductor substrate SB2. The thickness of semiconductor substrate SB2 can be, for example, about 200 µm, and the thickness of the protective film PA2 can be, for example, about 2 µm. After the wafer process, a wafer test (wafer inspection) step can be performed as needed.

As shown in FIG. 18, a dicing tape (film member for dicing) 10 used in the present embodiment has a laminated structure of a base material layer 11, an adhesive material layer (adhesive material layer) 12 on the base material layer 11, a conductive DAF (Die Attach Film) 13 on the adhesive material layer 12, an insulating DAF (Die Attach Film) 14 on a conductive DAF 13, and a cover layer (protective layer) 15 on an insulating DAF 14.

The base material layer 11 is made of an acrylic resin material or the like and has a thickness of, for example, about 100 µm. The adhesive material layer 12 is made of an ultraviolet curable typed adhesive material layer, and has a thickness of, for example, about 30 µm. The conductive DAF 13 is made of a thermosetting typed resin material including a conductive filler such as a silver filler, and has a thickness of, for example, about 25 µm to 75 µm. The insulating DAF 14 is made of a thermosetting typed resin material, and has a thickness of, for example, about 10 µm to 25 µm. The conductive DAF 13 can be regarded as a conductive bonding material layer. The insulating DAF 14 can be regarded as an insulating bonding material layer. The thickness of the conductive DAF 13 is preferably larger than the thickness of the insulating DAF 14. The cover layer 15 is made of a plastic film or the like and has a thickness of, for example, about 30 µm. The curing temperature of the conductive DAF 13 and the insulating DAF 14 is, for example, about 100 degrees Celsius to 150 degrees Celsius. At this stage, the conductive DAF 13 and the insulating DAF 14 are pre-cured.

The conductive DAF 13 contains a conductive filler such as a silver filler, and thus has a conductive property. On the other hand, the insulating DAF 14 has an insulation property, because it does not contain or contains a very small amount of conductive fillers. In other words, the content of the conductive filler in the conductive DAF 13 is higher than the content of the conductive filler in the insulating DAF 14.

The conductive DAF 13 is made of, for example, a thermosetting epoxy-resin that contains conductive fillers. Alternatively, as the conductive DAF 13, a laminated structure in which two thermosetting epoxy resin layers (an epoxy resin layer containing a conductive filler) and a thermosetting acrylic resin layer (an acrylic resin layer containing a conductive filler) are sandwiched may be applied. Further, the insulating DAF 14 is made of, for example, a thermosetting epoxy resin (epoxy resin layers not including conductive fillers). Alternatively, as the insulating DAF 14, a laminated structure in which two thermosetting epoxy resin layers (an epoxy resin layer not containing a conductive filler) and a thermosetting acrylic resin layer (an acrylic resin layer not containing a conductive filler) are sandwiched may be applied.

Figure 19:
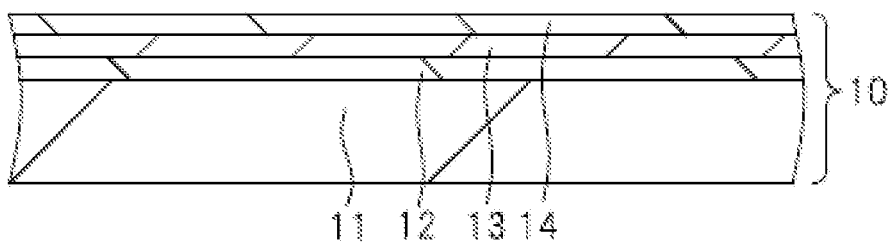
FIG. 19 is an explanatory view of a dicing step and a die bonding step.
Figure 20:
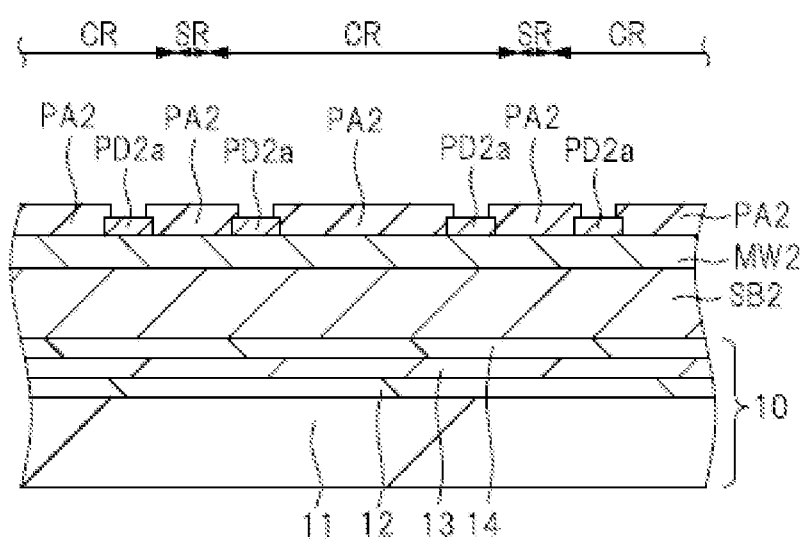
FIG. 20 is an explanatory view of a dicing step and a die bonding step.

In order to perform the dicing step, first, the covering layers 15 are peeled off from the dicing tape 10 to expose upper surface of the insulating DAF 14 (see FIG. 19). Next, the dicing tape 10 is attached to the back surface of semiconductor substrate SB2 (wafer-processed semiconductor substrate SB2) (see FIG. 20). For example, a wafer-processed semiconductor substrate SB2 can be placed on a stage (not shown) and the dicing tape 10 can be applied to the rear surface of semiconductor substrate SB2 by pressing the dicing tape 10 against the rear surface of semiconductor substrate SB2 with a roller or the like.

At this time, the dicing tape 10 is attached to the back surface of semiconductor substrate SB2 in a direction in which the back surface of DAF 14 of the dicing tape 10 faces upper surface. Therefore, the back surface of semiconductor substrate SB2 contacts upper surface of the insulating DAF 14 of the dicing tape 10. The insulating DAF 14 is a thermosetting type, but has not been subjected to a thermosetting process yet, and therefore has a certain degree of adhesiveness.

Figure 21:
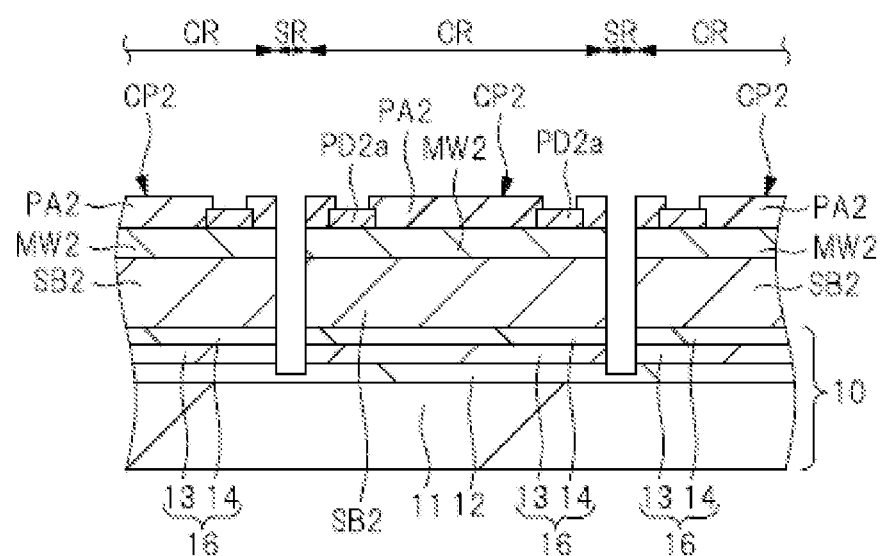
FIG. 21 is an explanatory view of a dicing step and a die bonding step.

Next, as shown in FIG. 21, a dicing step is performed. The dicing step is a step of cutting the scribed area SR of semiconductor substrate SB2 using a dicing blade (not shown). In the dicing step, semiconductor substrate SB is cut along the scribe area SR by using a rotating dicing blade. The multi-layer interconnect the passivation PA2 on MW2 and semiconductor substrate SB2 are also cut along with semiconductor substrate SB. As a result, the chip forming regions CR in semiconductor substrate SB are singulated, and the semiconductor chip CP2 is acquired from the singulated chip forming regions CR. In the present embodiment, although the scribe region SR is also provided with the protective film PA2, a part or all of the protective film PA2 may not be provided in the scribe region SR. More specifically, when the protective film PA2 is formed of the above-described laminated film, the scribed area SR may be provided with only an inorganic insulating film made of a relatively hard material instead of an organic insulating film made of a relatively soft material. Accordingly, it is possible to suppress a decrease in the cleavability of semiconductor substrate SB while protecting semiconductor substrate SB.

In the dicing step, the insulating DAF 14 and the conductive DAF 13 of the dicing tape 10 are also cut together with semiconductor substrate SB. However, the base layer 11 of the dicing tape 10 is not cut. Therefore, at the stage where the dicing process is completed, the plurality of semiconductor chips CP2 obtained by the dicing of semiconductor substrate SB2 are attached (fixed) to the dicing tape 10.

After the dicing step, a die bonding step of the semiconductor chip CP2 is performed in the following manner.

First, by performing an ultraviolet irradiation treatment, the pressure-sensitive adhesive layer 12 of the dicing tape 10 is irradiated with UV light to cure the pressure-sensitive adhesive layer 12. By curing the pressure-sensitive adhesive layer 12, the conductive DAF 13 can be peeled off from the cured pressure-sensitive adhesive layer 12.

Figure 22:
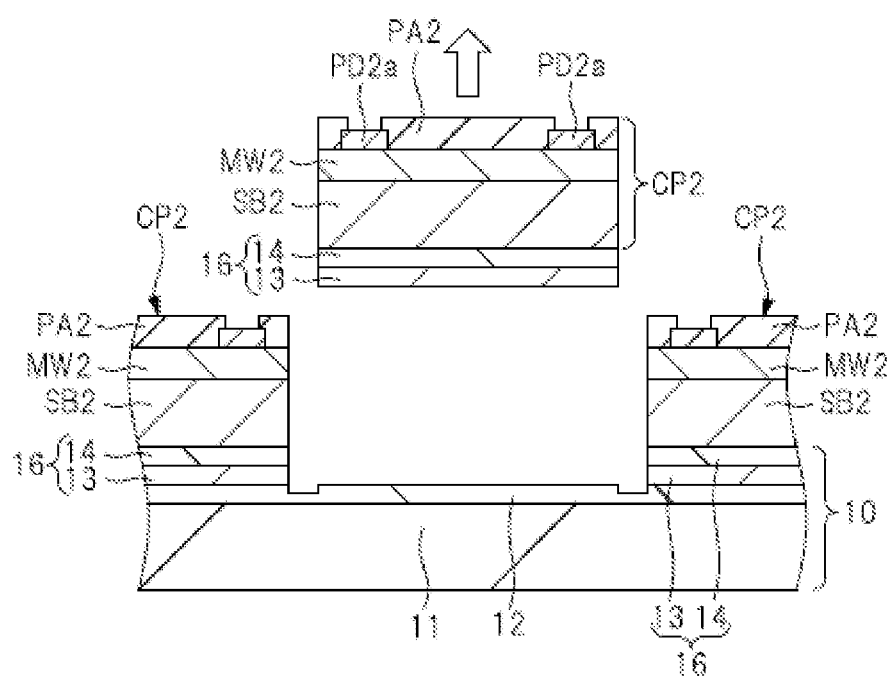
FIG. 22 is an explanatory view of a dicing step and a die bonding step.

Next, as shown in FIG. 22, the semiconductor chip CP2 is picked up by a pick-up tool (not shown). For example, the semiconductor chip CP2 is sucked and pulled up by the pick-up tool. When the semiconductor chip CP2 is picked up, the conductive DAF 13 is peeled off from the cured adhesive material layer 12, and the laminated body 16 of the conductive DAF 13 and the insulating DAF 14 is moved together with the semiconductor chip CP2. That is, the semiconductor chip CP2 picked up by the pick-up tool has the laminated body 16 of the conductive DAF 13 and the insulating DAF 14 attached to the back surface thereof. Note that, instead of the conductive DAF 13, an insulating DAF 14 is in contact with the back surface of the semiconductor chip CP2, and an insulating DAF 14 is interposed between the conductive DAF 13 and the back surface of the semiconductor chip CP2.

The picked-up semiconductor chip CP2 is transported by the pick-up tool and is arranged on the pad PD1b of the semiconductor chip CP1 mounted on a die pad DP of a lead frame via a bonding material BD1.

At this time, the semiconductor chip CP2 is disposed on the pad PD1*b* of the semiconductor chip CP1 in a direction in which the laminated body 16 (more specifically, the conductive DAF 13 of the laminated body 16) faces the pad PD1*b* of the semiconductor chip CP1 while the laminated body 16 of the conductive DAF 13 and the insulating DAF 14 is adhered to the back surface of the semiconductor chip CP2. Therefore, the semiconductor chip CP2 is mounted on the pad PD1*b* via the laminated body 16 such that the insulating DAF 14 of the laminated body 16 is in contact with the pad PD1*b*. When the semiconductor chip CP2 is disposed on the pad CP1 of the semiconductor chip PD1*b*, the laminated body 16 is interposed between the semiconductor chip CP2 and the pad CP1 of the semiconductor chip PD1*b*, and the conductive DAF 13 and the insulating DAF 14 are brought into contact with each other with the pad PD1*b* of the semiconductor chip CP2 such that the conductive DAF 13 is in contact with the back surface of the semiconductor chip OOI and the insulating DAF 14 is in contact with each other. Therefore, the insulating DAF 14, the conductive DAF 13, and the source electrode ES are arranged in this order from the top to the bottom of the semiconductor chip CP2.

Thereafter, a heat treatment is performed to cure the conductive DAF 13 and the insulating DAF 14. By this heat treatment, the conductive DAF 13 and the insulating DAF 14 are cured, and the semiconductor chip CP2 is bonded and fixed to the pad PD1*b* of the semiconductor chip CP1 by the cured conductive DAF 13 and the insulating DAF 14. The cured conductive DAF 13 corresponds to the conductive bonding material BD2*b*, the cured insulating DAF 14 corresponds to the insulating bonding material BD2*a*, and the cured laminate 16 corresponds to the bonding material BD2.

In this way, the die bonding process of the semiconductor chip CP2 is performed. The semiconductor chip CP2 is mounted on the pad PD1*b* of semiconductor device CP1 via a bonding material BD2 (cured laminate 16) and bonded by a die bonding process.

As shown in FIG. 21, in the dicing step, the insulating DAF 14 and the conductive DAF 13 are also cut together with semiconductor substrate SB2. Therefore, as can be seen from FIGS. 21 and 22, the side surface of the semiconductor chip CP2 and the side surface of the laminate 16 bonded to the back surface of the semiconductor chip CP2 (that is, the respective side surface of the insulating DAF 14 and the conductive DAF 13 each composing the laminated body 16) are aligned. Therefore, in the manufactured semiconductor device PKG, as can be seen from FIGS. 14 and 15, the side surface of the semiconductor chip CP2, the side surface of the insulating bonding material BD2*a*, and the side surface of the conductive bonding material BD2*b* are aligned with each other.

<History of Study>

The present inventors have studied a semiconductor device in which a control semiconductor chip is mounted on a semiconductor chip having a built-in power MOSFET. By mounting a control semiconductor chip on a semiconductor chip having a built-in power MOSFET, the planar dimension (planar area) of semiconductor device can be reduced.

Figure 23:
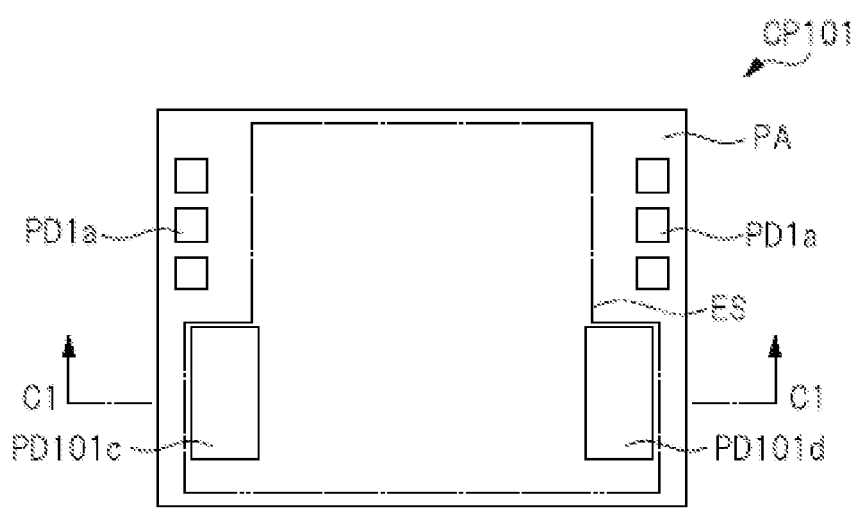
FIG. 23 is an upper surface view of a semiconductor chip used in a semiconductor device according to an examined example.
Figure 24:
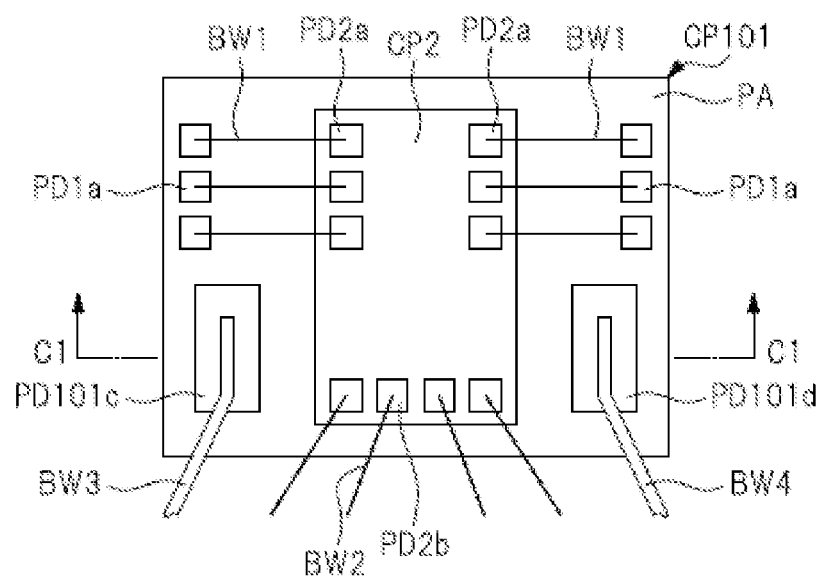
FIG. 24 is a plan view showing two semiconductor chips in the semiconductor device according to the examined example.
Figure 25:
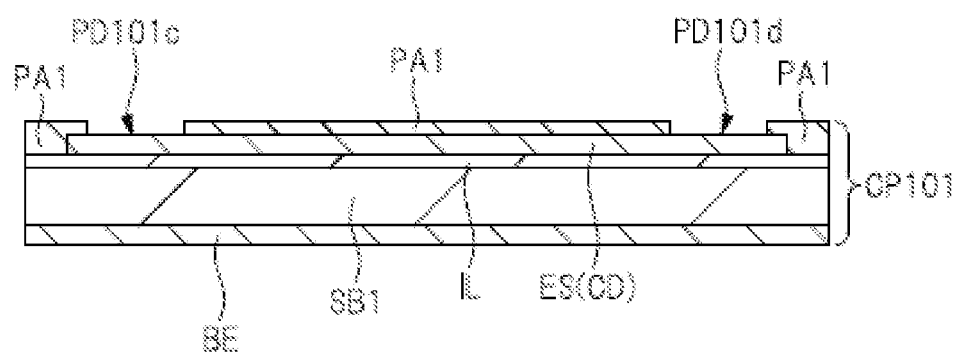
FIG. 25 is a cross-sectional view of the semiconductor chip used in the semiconductor device according to the examined example.
Figure 26:
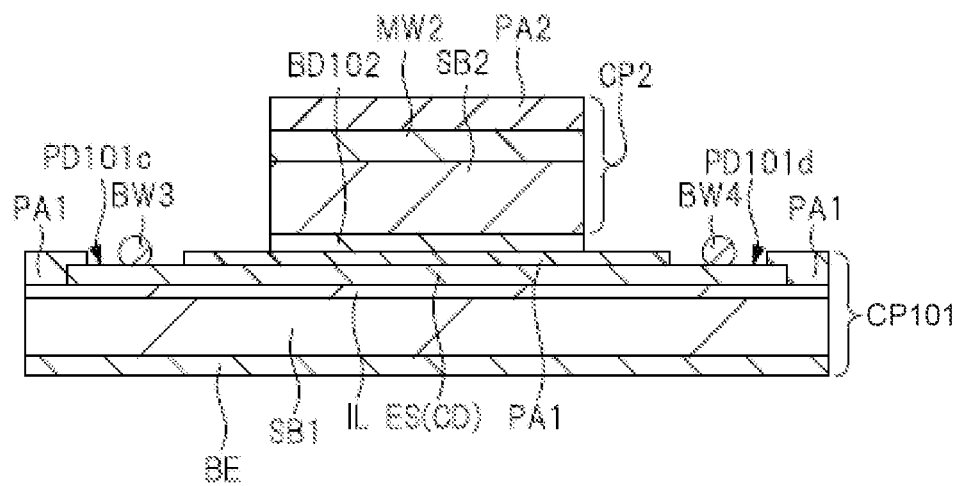
FIG. 26 is a cross-sectional view of the two semiconductor chips in the semiconductor device according to the examined example.

The examined example studied by the present inventors will be described by referring to FIG. 23 to FIG. 26. FIG. 23 is an upper surface view of a semiconductor chip CP101 incorporating a power MOSFET, and corresponds to FIG. 7. FIG. 24 is a plan view showing a state in which the semiconductor chip CP2 for controlling the semiconductor chip CP101 is mounted on the semiconductor chip CP101, and corresponds to FIG. 11. FIG. 25 is a cross-sectional view of the semiconductor chip CP101 at the position of C1-C1 line shown in FIG. 23, and corresponds to FIG. 12. FIG. 26 is a cross-sectional view of each semiconductor chip CP101, CP2 at the position of C1-C1 line shown in FIG. 24, and corresponds to FIG. 14. Similar to FIG. 14, the die pad DP and the sealing portion MR are not shown in FIG. 26.

The semiconductor chip CP101 used in the examined example corresponds to the semiconductor chip CP1, but the following points are different from the semiconductor chip CP1.

That is, in the semiconductor chip CP101 according to the examined example, the pad PD1*b* (opening portion OPS) is not provided, and instead, a pad PD101*c* for connecting the wire BW3 and a pad PD101*d* for connecting the wire BW4 are provided. Each of the pads PD101*c*, PD101*d* is formed by source electrode ES exposed from the protective film PAL in the opening portion of the protective film PA1. In a semiconductor chip CP101 of examined example, a protective film PA1 is present in an area where a semiconductor chip CP2 is to be mounted. That is, in the semiconductor chip CP101 of the examined example, the opening portion of the protective film PA1 is not formed in the region where the semiconductor chip CP2 is to be mounted. Therefore, in examined example, when the semiconductor chip CP101 is mounted with the semiconductor chip CP2, as can be seen from FIGS. 23 and 25, the semiconductor chip CP2 is mounted on the protective film PA1 of the semiconductor chip CP101 via the bonding material BD102. Therefore, in examined example, the bonding material BD102, the protective film PA1, and the source electrode ES are sequentially present from the top below the semiconductor chip CP2.

According to studies conducted by the present inventors, it was found that the following problems arise in the semiconductor device of examined example.

In each of the semiconductor chip CP1, CP101, since the plurality of unit transistor cells composing the power MOSFET are formed over a considerable region, the plurality of unit transistor cells are also formed immediately below the area where the semiconductor chip CP2 is mounted. Consequently, the source electrode ES is also present immediately below the region where the semiconductor chip CP2 is mounted.

However, when the resistance of the source electrode ES is large, the potential gradient generated in the source electrode ES increases, the ON-resistance of the power MOSFET increases, and the ON-current of the power MOSFET decreases. This leads to degradation of the performance of semiconductor device. In order to solve this problem, it is conceivable to connect wires to the source electrode ES at many points in each of the semiconductor chip CP1, CP101. However, in each of the semiconductor chip CP1, CP101, since a wire cannot be connected to the source electrode ES in a region where the semiconductor chip CP2 is mounted, the source electrode ES and the wire need to be connected at the position where the semiconductor chip CP2 is not mounted, and the source voltage needs to be supplied to the source regions of the plurality of unit transistor cells composing the power MOSFET through the source electrode ES.

It is also conceivable to reduce the resistor of the source electrode ES by increasing the thickness of the source electrode ES. However, if the thickness of the source electrode ES is excessively increased, shoulder shaving of the photoresist film used in this step may occur in the process of processing the source electrode ES, and processing failure may occur. In addition, the level difference of the protective film PA1 covering the source electrode ES formed (processed) by this processing step is increased, and consequently, the protective film PA1 is likely to be cracked. That is, since the outer peripheral end portion of the source electrode ES is covered with the protective film PA1, a step reflecting the outer peripheral end portion of the source electrode ES is formed on the protective film PA1, but if the source electrode ES is thick, the step of the protective film PA1 is also increased, and consequently, cracks are likely to occur in the step of the protective film PA1. Cracks in the protective film PA1 are likely to occur, for example, in a wire bonding process. In addition, if the thickness of the source electrode ES is too large, the pad is crushed during wire bonding, and the metallic material in the pad is rejected to the periphery. This may lead to a decrease in the reliability of semiconductor device. Therefore, it is not a good idea to reduce the ON-resistance of the power MOSFET only by increasing the thickness of the source electrode ES.

<Key Feature and Effect>

The semiconductor device PKG according to the present embodiment includes a die pad DP serving as a chip mounting portion, a semiconductor chip CP1 mounted on the die pad DP via a bonding material BD1, and a semiconductor chip CP2 mounted on the semiconductor chip CP1 via a bonding material BD2.

One of the main features of the present embodiment is that the semiconductor chip CP1 includes a protective film PA1 and a pad PA1 in the opening portion OPS of the protective film CP2 and exposed from the protective film PA1, and the semiconductor chip CP2 is mounted on the pad PD1$b$ of the semiconductor chip CP1 via a bonding material PD1$b$. The bonding material BD2 includes a conductive film-shaped bonding material BD2$b$ in contact with the pad PD1$b$, and an insulating film-shaped bonding material interposed between the bonding material BD2$b$ and the semiconductor chip CP2. As described above, the conductive bonding material BD2$b$ of a film shape is made of a conductive DAF 13, and the insulating bonding material BD2$a$ of a film shape is made of an insulating DAF 14.

In the present embodiment, in the semiconductor chip CP1, the protective film PA1 is not present in the region where the semiconductor chip CP2 is mounted. In the semiconductor chip CP1, a semiconductor chip CP2 is mounted on a pad PD1$b$ exposed from the protective film PA1 in the opening portion OPS of the protective film PA1 via a bonding material BD2. The bonding material BD2 includes a conductive film-shaped bonding material BD2$b$ in contact with the pad PD1$b$, and an insulating film-shaped bonding material BD2$a$ interposed between the bonding material BD2$b$ and the semiconductor chip CP2. When a current flows through the source electrode ES of the semiconductor chip CP1, the conductive bonding material BD2$b$ in contact with the pad PD1$b$ may also serve as a current path. Therefore, when a current flows through the source electrode OPS of the semiconductor chip PA1, it is possible to reduce the resistor when the current flows through the source electrode OPS of the semiconductor chip PA1 and to reduce the potential gradient generated in the source electrode PA1 by mounting the semiconductor chip CP2 on the pad PD1$b$ exposed from the protective film PA1 via the bonding material BD2 in the opening portion OPS of the protective film and having the conductive film shaped bonding material BD2$b$ in which the bonding material BD2 is in contact with the pad PD1$b$. Accordingly, the ON-resistance of the power MOS FET incorporated in the semiconductor chip CP1 can be reduced, and the ON-current can be increased. Consequently, the result of semiconductor device PKG can be improved.

In the semiconductor device PKG according to the present embodiment, an insulating film shaped bonding material BD2$a$ is interposed between the semiconductor chip CP2 and the conductive bonding material BD2$b$. Below the semiconductor chip CP2, the protective film PA1 of the semiconductor chip CP1 is not present, but the back surface of the semiconductor chip CP2 and the pad PD1$b$ of the semiconductor chip CP1 can be electrically insulated by the insulating bonding material BD2$a$.

In the present embodiment, the semiconductor chip CP1 is mounted with a bonding material PA1 having a conductive bonding material CP2 in contact with a source electrode ES on a source electrode ES (i.e., a pad PD1$b$) exposed in an opening portion OPS thereof, in which an opening portion OPS is provided on a protective film CP2 of the semiconductor chip ES so as to enclose an area to be mounted on the semiconductor chip. Therefore, in the semiconductor chip CP1, a conductive member (here, a conductive bonding material BD2$b$) can be formed on the source electrode ES even in an area overlapping with the semiconductor chip CP2 in a plan view. Therefore, it is possible to efficiently reduce the resistor when a current flows through the source electrode ES, and to efficiently reduce the potential gradient generated in the source electrode ES. Accordingly, the on-state current of the power MOSFET incorporated in the semiconductor chip CP1 can be accurately increased.

In the present embodiment, the bonding material BD2 for mounting the semiconductor chip CP2 is a film shaped bonding material, and DAF can be used. Therefore, when the laminated body 16 of the conductive DAF 13 and the insulating DAF 14 is attached to the back surface of the semiconductor chip CP2, the semiconductor chip CP2 is mounted on the pad PD1$b$ of the semiconductor chip CP1, it is possible to reduce the resistor when a current flows in the source electrode ES of the semiconductor chip CP1 by the conductive bonding material BD2$b$ formed of the conductive DAF 13 adjoining the pad CP1. That is, since DAF material having the lowermost conductive DAF 13 and the insulating DAF 14 thereon may be used as the bonding material BD2 for mounting the semiconductor chip CP2, it is possible to reduce the resistor when a current flows through the source electrode ES of the semiconductor chip CP1, and to suppress the number of the manufacturing process of the semiconductor device. As a consequence, the performance of the semiconductor device can be improved, and the manufacturing cost of the semiconductor device can be reduced.

Here, it is assumed that, unlike the present embodiment, a paste-type conductive bonding material such as a silver paste or a solder paste is used as the conductive bonding material BD2$b$ included in the bonding material BD2 for mounting the semiconductor chip CP2. In this case, since the paste type conductive bonding material has fluidity, if the thickness of the conductive bonding material BD2$b$ is to be increased, the semiconductor chip CP2 mounted on the pad PD1$b$ of the semiconductor chip CP1 via the bonding material BD2 tends to incline. The inclination of the semiconductor chip CP2 is undesirable because it may prevent the wire BW1, BW2 from being accurately connected to the pad PD2$a$, PD2$b$ of the semiconductor chip CP2 in the wire bonding process. In other words, if the thickness of the conductive bonding material BD2$b$ formed by using the paste-type conductive bonding material is reduced, the inclination of the semiconductor chip CP2 can be prevented, but reducing the thickness of the conductive bonding material BD2b reduces the resistor when a current flows through the source electrode ES of the semiconductor chip CP1 by the conductive bonding material BD2b.

On the other hand, in the present embodiment, a film typed bonding material is used instead of a paste typed conductive bonding material as a conductive bonding material BD2b included in a bonding material BD2 for mounting the semiconductor chip CP2, and specifically, a conductive DAF 13 is used. Therefore, even if the thickness of the conductive bonding material BD2b is increased, it is possible to suppress or prevent the semiconductor chip CP2 mounted on the pad PD1b of the semiconductor chip CP1 via the bonding material BD2 from being inclined. Therefore, even if the thickness of the conductive bonding material BD2b is increased, the wire BW1, BW2 can be accurately connected to the pad PD2a, PD2b of the semiconductor chip CP2 in the wire bonding step. Since the thickness of the conductive bonding material BD2b can be increased by using a film-shaped bonding material instead of the paste-type conductive bonding material as the conductive bonding material BD2b, the resistor when a current flows through the source electrode ES of the semiconductor chip CP1 by the conductive bonding material BD2b can be further increased.

The thickness of the conductive bonding material BD2b is preferably larger than the thickness of the insulating bonding material BD2a. That is, the thickness of the conductive DAF 13 is preferably larger than the thickness of the insulating DAF 14. The reason is as follows.

When a current flows in the source electrode ES of the semiconductor chip CP1, the resistor when a current flows in the source electrode ES of the semiconductor chip CP1 can be reduced as the thickness of the conductive bonding material BD2b is increased because the conductive bonding material BD2b in contact with the pad PD1b can also serve as a current path. Therefore, it is desirable to increase the thickness of the conductive bonding material BD2b from the viewpoint of minimizing the resistor when a current flows through the source electrode ES of the semiconductor chip CP1. However, when the thickness of the entire bonding material BD2 is increased (that is, when the thickness of the laminate 16 is increased), the thickness of semiconductor device PKG is increased, and there is a possibility that the die bonding process of the semiconductor chip CP2 is not easily performed. Therefore, it is not advisable to excessively increase the thickness of the entire bonding material BD2 (that is, the thickness of the laminate 16). On the other hand, the insulating bonding material BD2a is used to ensure insulation between the pad PD1b of the semiconductor chip CP1 and the semiconductor chip CP2. Therefore, the thickness of the insulating bonding material BD2a may be any thickness as long as it can ensure the electric insulation between the pad CP1 of the semiconductor chip PD1b and the semiconductor chip CP2, and it is less advantageous to increase the thickness of the insulating bonding material BD2a.

Therefore, the thickness of the conductive bonding material BD2b is made thicker than the thickness of the insulating bonding material BD2a. That is, the thickness of the conductive DAF 13 is made thicker than the thickness of the insulating DAF 14. This allows a majority of the thickness of the bonding material BD2 to be assigned to the conductive DAF 13. The conductive bonding material BD2b (conductive DAF 13) has a thickness larger than the thickness of the insulating bonding material BD2a (insulating DAF 14), so that the conductive bonding material BD2b can be more effective in reducing the resistor when a current flows through the source electrode ES of the semiconductor chip CP1. Then, by making the thickness of the insulating bonding material BD2a (insulating DAF 14) thinner than the thickness of the conductive bonding material BD2b (conductive DAF 13), the thickness of the entire bonding material BD2 (that is, the thickness of the laminate 16) can be suppressed, so that the thickness of semiconductor device PKG can be suppressed, and the die bonding process of the semiconductor chip CP2 can be easily performed. The thickness of the conductive bonding material BD2b (conductive DAF 13) may be, for example, about 25 µm to 75 µm, and the thickness of the insulating bonding material BD2a (insulating DAF 14) may be, for example, about 10 µm to 25 µm.

The wire BW3 is a wire for electrically connecting the source electrode ES of the semiconductor chip CP1 and the lead LD1, and the wire BW4 is a wire for electrically connecting the source electrode ES of the semiconductor chip CP1 and the lead LD2. In the present embodiment, the wire BW3 and the wire BW4 are connected to the pad PD1b of the semiconductor chip CP1. Therefore, each of the wire BW3, BW4 can be accurately electrically connected to the source electrode ME.

In the present embodiment, in a plan view, the semiconductor chip CP2 is disposed between a connecting point of the wire BW3 and the pad PD1b and a connecting point of the wire BW4 and the pad PD1b. Accordingly, the potential gradient generated in the source electrode ES when a current flows through the source electrode ES can be more efficiently reduced. Therefore, the on-state current of the power MOSFET incorporated in the semiconductor chip CP1 can be more accurately increased.

Second Embodiment

Figure 27:
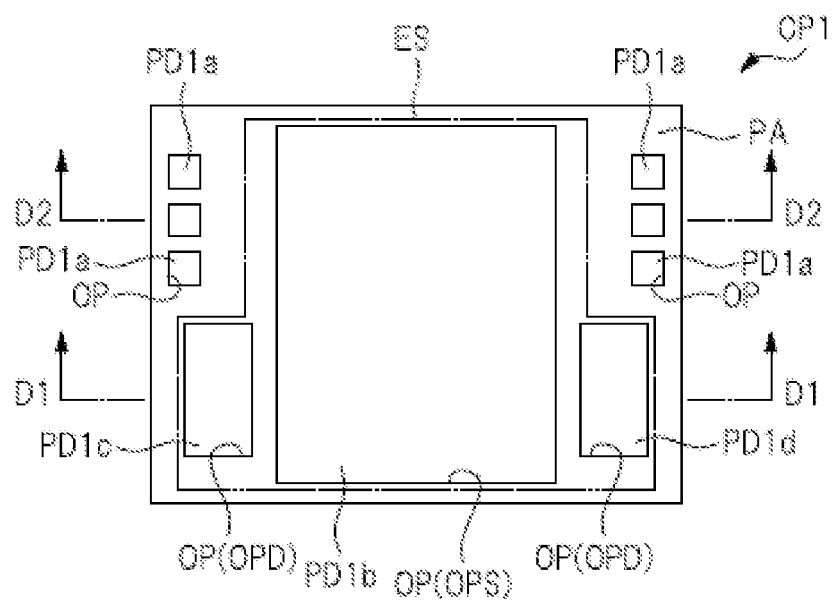
FIG. 27 is an upper surface view of a semiconductor chip used in a semiconductor device according to a second embodiment.
Figure 28:
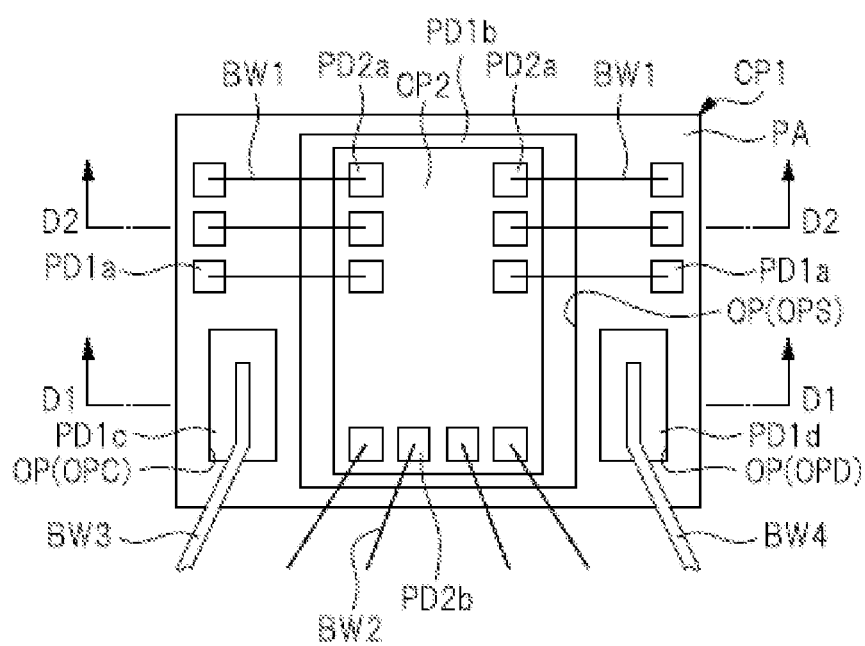
FIG. 28 is a plan view showing two semiconductor chips in the semiconductor device according to the second embodiment.
Figure 29:
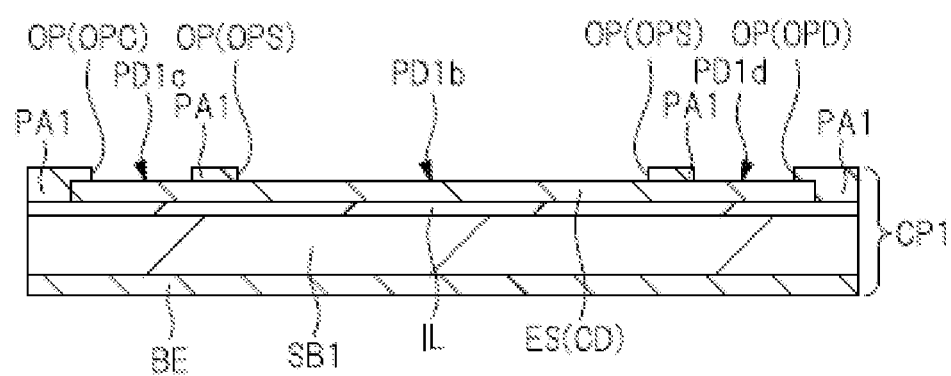
FIG. 29 is a cross-sectional view of the semiconductor chip used in the semiconductor device according to the second embodiment.
Figure 30:
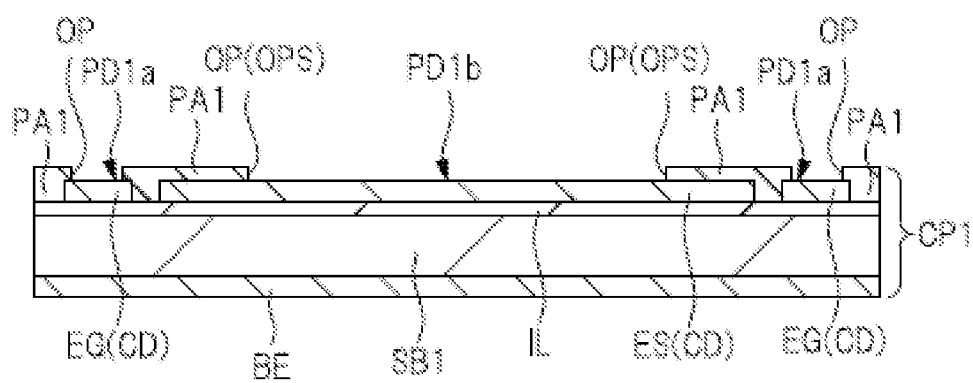
FIG. 30 is a cross-sectional view of the semiconductor chip used in the semiconductor device according to the second embodiment.
Figure 31:
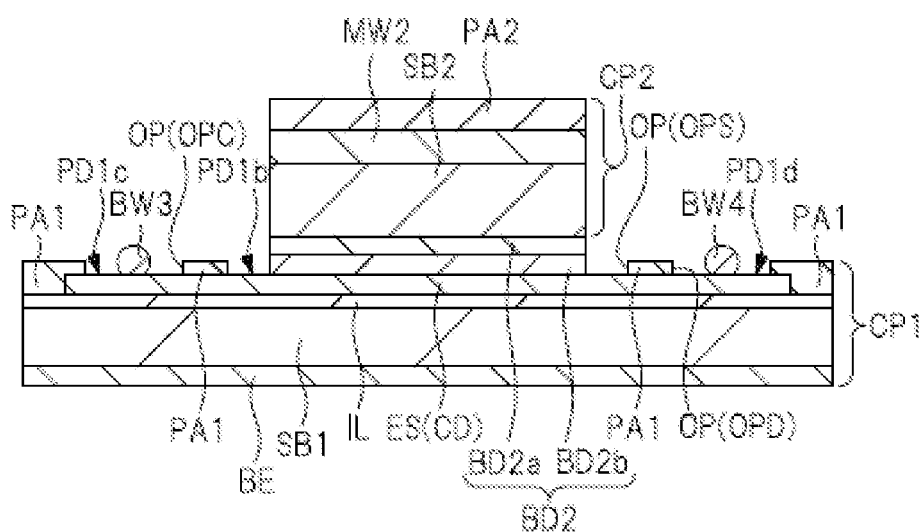
FIG. 31 is a cross-sectional view of the two semiconductor chips in the semiconductor device according to the second embodiment.
Figure 32:
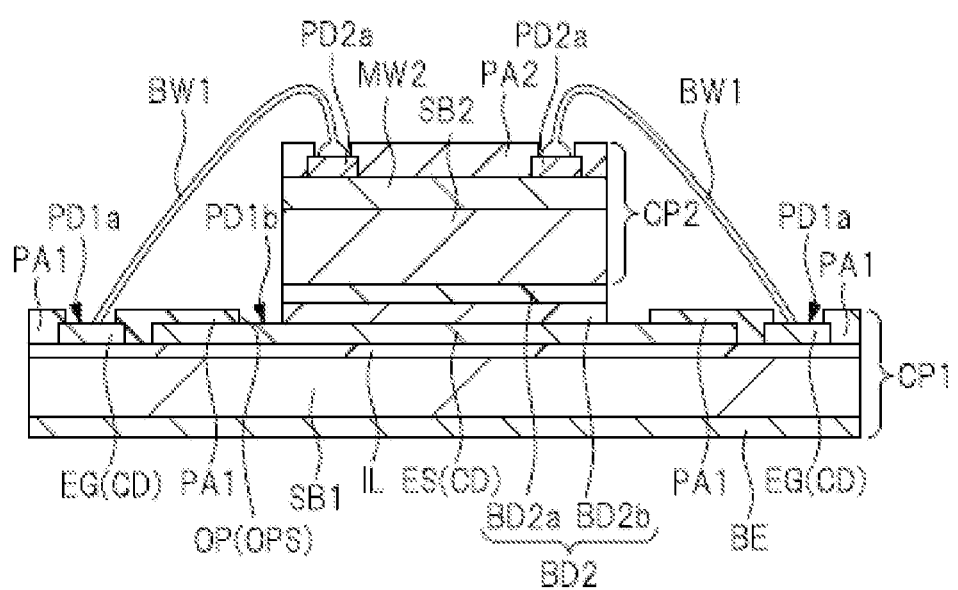
FIG. 32 is a cross-sectional view of the two semiconductor chips in the semiconductor device according to the second embodiment.

A semiconductor device PKG according to the present second embodiment will be described by referring to FIG. 27 to FIG. 32. FIG. 27 is an upper surface view of a semiconductor chip CP1 used in a semiconductor device PKG according to the present second embodiment, and corresponds to FIG. 7. FIG. 28 is a plan view showing each semiconductor chip CP1, CP2 in the semiconductor device PKG of the present second embodiment, and corresponds to FIG. 11. FIG. 29 and FIG. 30 are a cross-sectional view of a semiconductor chip CP1 prior to mounting the semiconductor chip CP2 on the semiconductor chip CP1. FIG. 29 corresponds to a cross-sectional view of the semiconductor chip CP1 at the position of D1-D1 line shown in FIG. 27, and FIG. 30 corresponds to a cross-sectional view of the semiconductor chip CP1 at the position of D2-D2 line shown in FIG. 27. FIG. 31 and FIG. 32 are a cross-sectional view of each semiconductor chip CP1, CP2 in the semiconductor device PKG according to the present second embodiment. FIG. 31 corresponds to a cross-sectional view of each semiconductor chip CP1, CP2 at the position of D1-D1 line shown in FIG. 28, and FIG. 32 corresponds to a cross-sectional view of each semiconductor chip CP1, CP2 at the position of D2-D2 line shown in FIG. 28. In FIG. 31 and FIG. 32, the die pad DP and the sealing portion MR are not shown.

In the following points, the semiconductor chip CP1 used in the semiconductor device PKG according to the present second embodiment is different from the semiconductor chip CP1 used in the semiconductor device PKG according to the first embodiment described above.

That is, in the semiconductor chip CP1 of the first embodiment, the pad PDb for mounting the semiconductor chip CP2 thereon also serves as a pad for connecting the wire BW3 thereto as well as a pad for connecting the wire BW4 thereto.

On the other hand, in the semiconductor chip CP1 of the present second embodiment, the pad PD1b for mounting the semiconductor chip CP2 thereon, the pad PD1c for connecting the wire BW3 thereto, and the pad PD1d for connecting the wire BW4 thereto are separately provided. Each of the pads PD1b, PD1c, PD1d is formed by source electrode ES exposed from the protective film PA1 in the opening portion OP of the protective film PA1. For this reason, the pads PD1b, PD1c, PD1d are electrically connected to each other through the source electrode.

Here, the opening portion OP exposing the pad PD1b is referred to as an opening portion OP with reference numeral OPS, and the opening portion OPS exposing the pad PD1c is referred to as an opening portion OPD with reference numeral OPC, and the opening portion OPC exposing the pad PD1d is referred to as an opening portion OPC with reference numeral OOH. In the opening portion OPS of the protective film PA1, the source electrode ES exposed from the protective film PA1 is the pad PD1b, and the source electrode ES exposed from the protective film PA1 in the opening portion OPD of the protective film PA1 is the pad PA1, and the source electrode ES exposed from the protective film PD1d in the opening portion OPC of the protective film PA1 is the pad PD1b. The planar shape, the planar dimension (planar area) and the planar position of the opening portion OPS substantially coincide with the planar shape, the planar dimension and the planar position of the pad PD1b. The planar shape, the planar dimension and the planar position of the opening portion OPC substantially coincide with the planar shape, the planar dimension and the planar position of the pad PD1c. The planar shape, the planar dimension and the planar position of the opening portion OPD substantially coincide with the planar shape, the planar dimension and the planar position of the pad PD1d.

In the semiconductor chip CP1 of the present second embodiment, the opening portions OPS, OPC, OPD of the protective film PA1 are not connected to each other and are separated from each other. Therefore, in a plan view, the protective film PAL exists between the opening portions OPS, OPC, OPD of the protective film PA1 (and thus between the pad PD1b, PD101c, PD101d). In the semiconductor chip CP1 of the present second embodiment, a connection between the opening portion OPS of the protective film PA1, the opening portion OPC, and the opening portion OPD substantially corresponds to the opening portion OPS of the protective film PAL in the semiconductor chip CP1 of first embodiment. In the semiconductor chip CP1 of the present second embodiment, since the opening portion OPS is arranged between the opening OPC and the opening portion OPD in a plan view, the pad PD1b is arranged between the pad PD1c and the pad PD1d.

Besides, since the semiconductor chip CP1 used in the semiconductor device PKG according to the present second embodiment is also the same as the semiconductor chip CP1 used in the semiconductor device PKG according to first embodiment, repeated explanation thereof will be omitted here.

In addition, the following points are different between the semiconductor device PKG according to the present second embodiment and the semiconductor device PKG according to the first embodiment described above.

In the semiconductor device PKG of the first embodiment, the semiconductor chip CP2 is mounted on the pad PD1b of the semiconductor chip CP1 via the bonding material BD2, and each of the wire BW3, BW4 is connected to the pad PD1b of the semiconductor chip CP1. On the other hand, in second embodiment of semiconductor device PKG, the wire second embodiment is connected to the pad CP1 of the semiconductor chip semiconductor device PKG by mounting the semiconductor chip CP2 on the pad PD1b of the semiconductor chip CP1 via the bonding material BD2, the wire BW3 is connected to the pad PD1c of the semiconductor chip CP1, and the wire CP2 is connected to the pad.

That is, in the present second embodiment, one end portion of both ends of the wire BW3 is connected to the pad PD1c of the semiconductor chip CP1, and the other end portion thereof is connected to the lead LD3 (inner lead portion). In addition, one end portion of both end portions of the wire BW4 is connected to the pad PD1d of the semiconductor chip CP1, and the other end portion is connected to the lead LD4 (inner lead portion). Accordingly, the source electrode ES and the lead LD1 are electrically connected via the wire BW3, and the source electrode ES and the lead LD2 are electrically connected via the wire BW4.

The bonding material BD2 of the present second embodiment is the same as that of first embodiment described above, and therefore, repeated explanation thereof will be omitted here.

Since the semiconductor device PKG of second embodiment is substantially the same as semiconductor device PKG of first embodiment, repeated explanation thereof will be omitted here.

Also in the present second embodiment, the semiconductor chip CP2 is mounted on the pad PD1d of the semiconductor chip CP1 via a bonding material BD2 same to that of first embodiment. Therefore, the present second embodiment can also obtain the advantages described in the above first embodiment.

Further, in the present second embodiment, the area of the area covered with the protective film PA1 in the source electrode ES is larger than that of first embodiment. Therefore, in the present second embodiment, it is possible to improve the effectiveness of protecting the source electrode ES with the protective film PA1.

In the present second embodiment, the pad PB1b is located between the pad PD1c and the pad electrode PD1d in a plan view. As in first embodiment, in the present second embodiment, the semiconductor chip CP2 is disposed between the connecting point of the wire BW3 and the pad PD1b and the connecting point of the wire BW4 and the pad PD1b in a plan view. Accordingly, the potential gradient generated in the source electrode ES when a current flows through the source electrode ES can be more efficiently reduced. Therefore, the on-state current of the power MOSFET incorporated in the semiconductor chip CP1 can be more accurately increased.

Third Embodiment

Figure 33:
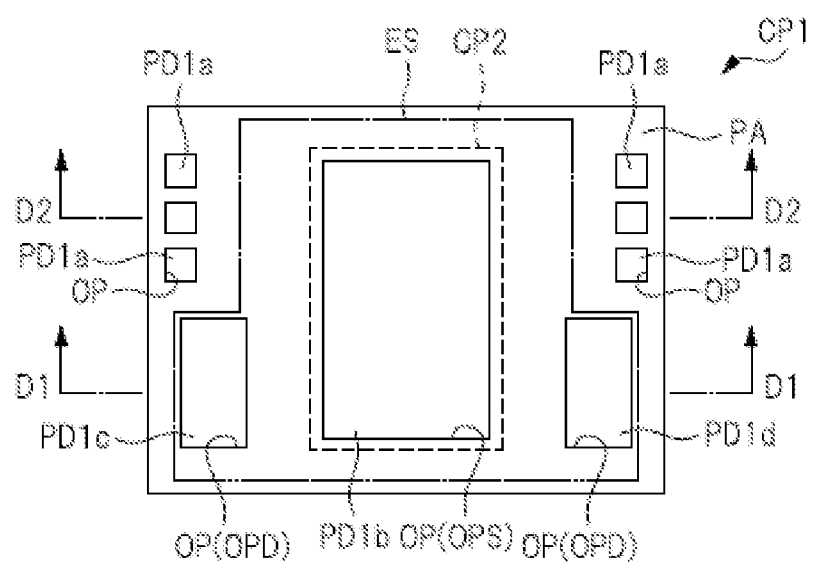
FIG. 33 is an upper surface view of a semiconductor chip used in a semiconductor device according to a third embodiment.
Figure 34:
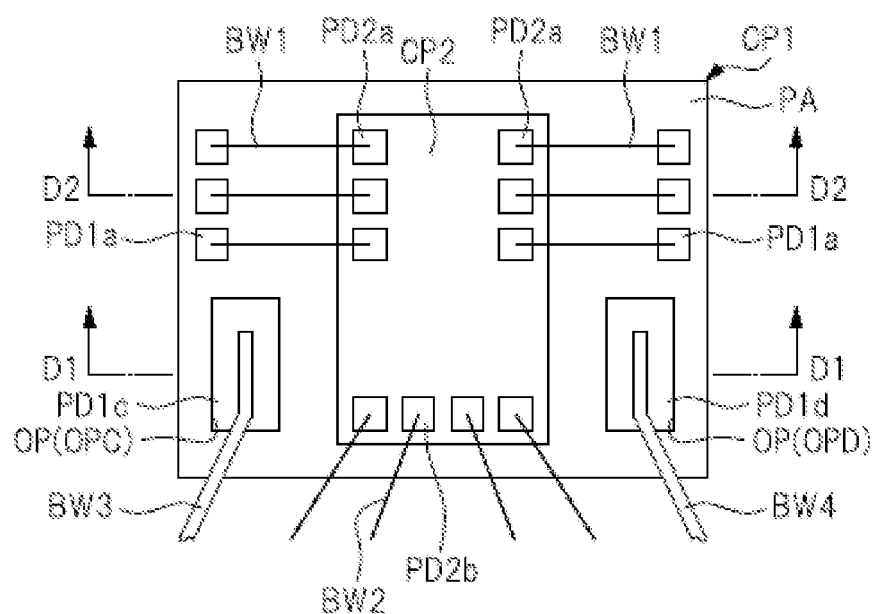
FIG. 34 is a plan view showing two semiconductor chips in the semiconductor device according to the third embodiment.
Figure 35:
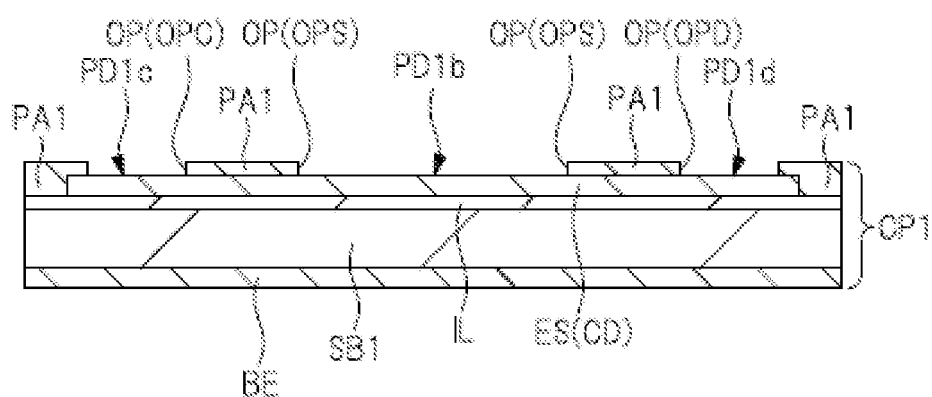
FIG. 35 is a cross-sectional view of the semiconductor chip used in the semiconductor device according to the third embodiment.
Figure 36:
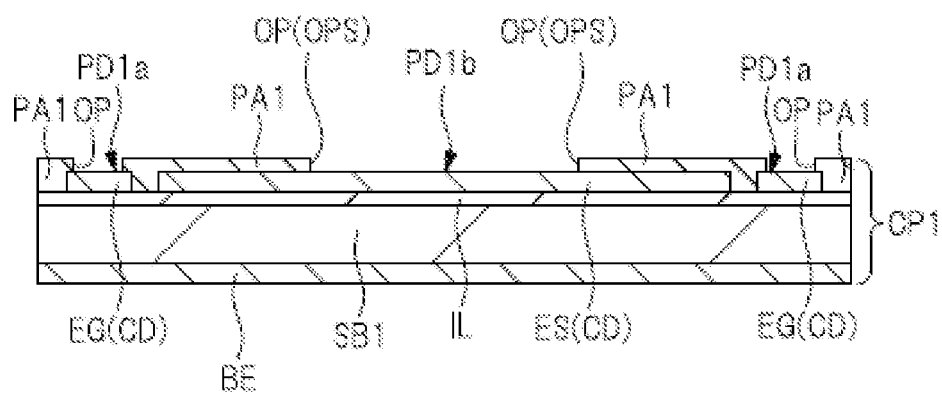
FIG. 36 is a cross-sectional view of the semiconductor chip used in the semiconductor device according to the third embodiment.
Figure 37:
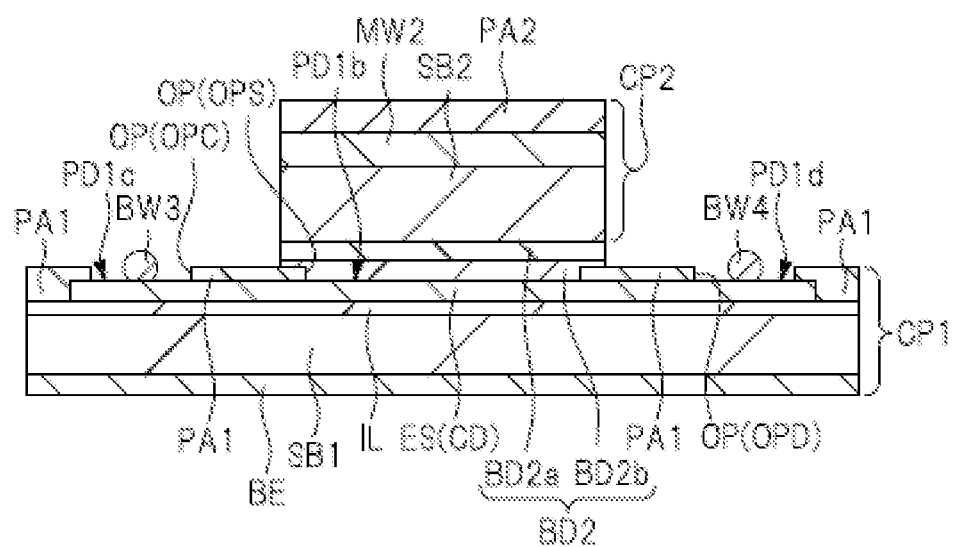
FIG. 37 is a cross-sectional view of the two semiconductor chips in the semiconductor device according to the third embodiment.
Figure 38:
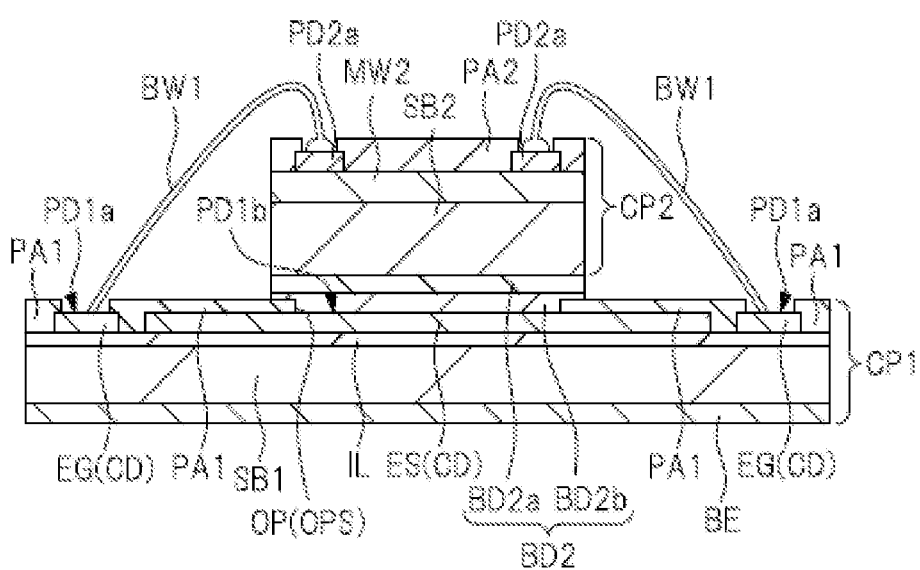
FIG. 38 is a cross-sectional view of the two semiconductor chips in the semiconductor device according to the third embodiment.

A semiconductor device PKG of the present third embodiment will be described by referring to FIG. 33 to FIG. 38. FIG. 33 is an upper surface view of a semiconductor chip CP1 used in a semiconductor device PKG according to the present third embodiment, and corresponds to FIGS. 7 and 27. In FIG. 33, the position of the semiconductor chip CP2 when the semiconductor chip CP2 is mounted on the semiconductor chip CP1 is indicated by a dotted line. FIG. 34 is a plan view showing each semiconductor chips CP1, CP2 in the semiconductor device PKG according to the present third embodiment, and corresponds to FIGS. 11 and 28. FIG. 35 and FIG. 36 are a cross-sectional view of the semiconductor chip CP1 prior to mounting the semiconductor chip CP2 on the semiconductor chip CP1. FIG. 35 corresponds to a cross-sectional view of the semiconductor chip CP1 at the position of D1-D1 line shown in FIG. 33, and FIG. 36 corresponds to a cross-sectional view of the semiconductor chip CP1 at the position of D2-D2 line shown in FIG. 33. FIG. 37 and FIG. 38 are a cross-sectional view of each semiconductor chip CP1, CP2 in the semiconductor device PKG according to the present third embodiment. FIG. 37 corresponds to a cross-sectional view of the semiconductor chip CP1, CP2 at the position of D1-D1 line shown in FIG. 34, and FIG. 38 corresponds to a cross-sectional view of the semiconductor chip CP1, CP2 at the position of D2-D2 line shown in FIG. 34. In FIG. 37 and FIG. 38, the die pad DP and the sealing portion MR are not shown.

The semiconductor device PKG according to the present third embodiment is different from the semiconductor device PKG according to the second embodiment described above, in the following points.

In the semiconductor device PKG according to the second embodiment, the semiconductor chip CP2 is included in the pad PD1b of the semiconductor chip CP1 in a plan view. Therefore, the semiconductor chip CP2 is included in the opening portion OPS of the protective film PA1 of the semiconductor chip CP1. Therefore, in second embodiment, the semiconductor chip CP2 does not overlap with the protective film PAL in a plan view. Therefore, the bonding material BD2 does not overlap with the protective film PA1. In another aspect, in the second embodiment, the bonding material BD2 is not in contact with the protective film PA1. More specifically, the outer peripheral portion of the bonding material BD2b is not in contact with the protective film PA1.

In contrast, in the semiconductor device PKG of the present third embodiment, the pad PD1b of the semiconductor chip CP1 is included in the semiconductor chip CP2 in a plan view. Therefore, the opening portion OPS of the protective film PA1 is included in the semiconductor chip CP2. That is, the planar dimension (planar area) of the opening portion OPS of the protective film PAL is smaller in the present third embodiment than in the second embodiment. Therefore, in the present third embodiment, a part of the semiconductor chip CP2 (more specifically, an outer peripheral portion of the semiconductor chip CP2) overlaps with the protective film PA1 in a plan view. Therefore, a part of the bonding material BD2 (more specifically, the outer peripheral portion of the bonding material BD2) overlaps with the protective film PA1. In another aspect, in the present third embodiment, a part of the bonding material BD2 (more specifically, an outer peripheral portion of the bonding material BD2b) is in contact with the protective film PA1.

Since the semiconductor device PKG of third embodiment is substantially the same as semiconductor device PKG of the second embodiment, repeated explanation thereof will be omitted here.

In first embodiment and second embodiment, since the semiconductor chip CP2 does not overlap with the protective film PA in plan view, the entire lower surface of the conductive bonding material BD2b included in the bonding material BD2 can be in contact with the pad PD1b of the semiconductor chip CP1. Therefore, when a current flows through the source electrode ES of the semiconductor chip CP1, almost the entire conductive bonding material BD2b may serve as a current path.

On the other hand, in the present third embodiment, a part of the semiconductor chip CP2 overlaps with the protective film PA in a plan view, and therefore, a part of the conductive bonding material BD2b included in the bonding material BD2 is located on the protective film PA1. Therefore, when a current flows through the source electrode ES of the semiconductor chip CP1, the conductive bonding material BD2b located on the pad PD1b can serve as a current path, but the conductive bonding material BD2b located on the protective film PA1 does not function as a current path.

Therefore, compared with the present third embodiment, first embodiment and second embodiment can be more effective in reducing the resistor when a current flows through the source electrode ES of the semiconductor chip CP1 by the conductive bonding material BD2b. Therefore, first embodiment and second embodiment can more effectively reduce the potential gradient generated in the source electrode ES than in the present third embodiment, further reduce the ON-resistance of the power MOSFET incorporated in the semiconductor chip CP1, and further increase the ON-current.

On the other hand, the present third embodiment has the following advantages compared to first embodiment and second embodiment described above.

The electrical insulation between the pad PD1b of the semiconductor chip CP1 and the semiconductor chip CP2 is ensured by an insulating bonding material BD2a included in the bonding material BD2. Therefore, a short-circuit path between the pad PD1b of the semiconductor chip CP1 and the semiconductor chip CP2 may be a path from the side surface of semiconductor substrate SB2 composing the semiconductor chip CP2 to the pad PD1b of the semiconductor chip BD2 through the side surface of the bonding material. In the present third embodiment, since the outer peripheral portion of the bonding material BD2 is located on the protective film PA1 (riding on), a path from the side surface of CP2 of the semiconductor chip to the side surface of the bonding material BD2 to the pad semiconductor substrate SB2 of the semiconductor chip CP1 becomes long. Consequently, it is possible to more accurately suppress or prevent a short circuit from occurring in a path from the side surface of semiconductor substrate SB2 composing the semiconductor chip CP2 to the pad PD1b of the semiconductor chip CP1 through the side surface of the bonding material BD2.

In the present third embodiment, if the thickness of the bonding material BD2 (laminate 16) is thinner than the thickness of the protective film PA1, it is difficult to mount the semiconductor chip CP2 on the pad CP1 of the semiconductor chip via the bonding material BD2 (laminate). Therefore, in the present third embodiment, the thickness of the bonding material BD2 (laminate 16) is preferably larger than the thickness of the protective film PA1. The thickness of the protective film PA1 may be, for example, about 2 micrometers. The respective thicknesses of the conductive bonding material BD2b (conductive DAF 13) and the insulating bonding material BD2a (insulating DAF 14) are as described in first embodiment above.

The invention made by the present inventor has been described above in detail based on the embodiment, but the present invention is not limited to the embodiment described above, and it is needless to say that various modifications can be made without departing from the gist thereof.

What is claimed is:

1. A semiconductor device comprising:
a chip mounting portion;
   a first semiconductor chip mounted on the chip mounting portion via a first bonding material; and
   a second semiconductor chip mounted on the first semiconductor chip via a second bonding material,
   wherein the first semiconductor chip includes:
      a protective film; and
      a first pad electrode exposed from the protective film in a first opening portion of the protective film,
   wherein the second semiconductor chip is mounted on the first pad electrode of the first semiconductor chip via the second bonding material,
   wherein the second bonding material includes:
      a first member being in contact with the first pad electrode; and
      a second member interposed between the first member and the second semiconductor chip,
   wherein the first member is a conductive bonding material of a film shape,
   wherein the second member is an insulating bonding material of a film shape, and
   wherein the second semiconductor chip is mounted on the first semiconductor chip such that the second semiconductor chip does not overlap the protective film and such that the first member is not in contact with the protective film.

2. The semiconductor device according to claim 1, wherein a thickness of the first member is greater than a thickness of the second member.

3. The semiconductor device according to claim 1, wherein the first semiconductor chip includes:
   a first semiconductor substrate;
   a MOSFET formed in the first semiconductor substrate; and
   the first pad electrode that is a source electrode electrically connected with a source of the MOSFET.

4. The semiconductor device according to claim 3,
   wherein the first semiconductor chip further includes a drain electrode formed on a back surface of the first semiconductor chip and electrically connected with a drain of the MOSFET,
   wherein the first semiconductor chip is mounted on the chip mounting portion via the first bonding material such that the drain electrode faces the chip mounting portion,
   wherein the first bonding material is a conductive bonding material, and
   wherein the drain electrode of the first semiconductor chip is electrically connected to the chip mounting portion via the first bonding material.

5. The semiconductor device according to claim 4,
   wherein the MOSFET is comprised of a plurality of unit transistor cells formed in the first semiconductor substrate and coupled in parallel to each other.

6. The semiconductor device according to claim 3, further comprising:
   a first lead;
   a second lead;
   a first wire electrically connecting the first pad electrode with the first lead; and
   a second wire electrically connecting the first pad electrode with the second lead.

7. The semiconductor device according to claim 6, wherein, in plan view, the second semiconductor chip is disposed between a connecting point of the first wire and the first pad electrode and a connecting point of the second wire and the first pad electrode.

8. The semiconductor device according to claim 6,
   wherein the first semiconductor chip further includes:
      a second pad electrode exposed from the protective film in a second opening portion of the protective film, connected to the first pad electrode, and which is a part of the source electrode; and
      a third pad electrode exposed from the protective film in a third opening portion of the protective film, connected to the first pad electrode, and which is a part of the source electrode,
   wherein the first wire is connected to the second pad electrode, and
   wherein the second wire is connected to the third pad electrode.

9. The semiconductor device according to claim 8, wherein, in plan view, the first pad electrode is arranged between the second pad electrode and the third pad electrode.

10. The semiconductor device according to claim 6,
    wherein the first semiconductor chip further includes a plurality of fourth pad electrodes,
    wherein the second semiconductor chip has a plurality of fifth pad electrodes, and
    wherein the plurality of fourth pad electrodes of the first semiconductor chip and the plurality of fifth pad electrodes of the second semiconductor chip are electrically connected with each other, respectively, via a plurality of third wires.

11. The semiconductor device according to claim 1, further comprising:
    a sealing portion sealing the chip mounting portion, the first semiconductor chip and the second semiconductor chip.

12. The semiconductor device according to claim 1, wherein the second semiconductor chip is a semiconductor chip for controlling the first semiconductor chip.

13. A method of manufacturing a semiconductor device, comprising steps of:
    (a) mounting a first semiconductor chip on a chip mounting portion via a first bonding material;
    (b) preparing a semiconductor substrate having a plurality of chip forming regions and a scribe region between the plurality of chip forming regions;
    (c) preparing a dicing tape including:
       a second bonding material layer having a conductive property, and
       a third bonding material layer having an insulation property, the third bonding material layer on the second bonding material layer;
    (d) after the step of (b) and the step (c), attaching the dicing tape to a back surface of the semiconductor substrate such that the third bonding material layer is in contact with the back surface of the semiconductor substrate;
    (e) after the step of (d), cutting the semiconductor substrate, the third bonding material layer, and the second bonding material layer along the scribe region; and (f) after the step of (a) and the step (e), mounting a second semiconductor chip, which is one of the plurality of chip forming regions singulated in the step of (e), on the first semiconductor chip via a laminated body, which is attached to the second semiconductor chip, of the third bonding material layer and the second bonding material layer, wherein the first semiconductor chip includes:
   a protective film; and
   a first pad electrode exposed from the protective film in a first opening portion of the protective film, wherein, in the step (f), the second semiconductor chip is mounted on the first pad electrode via the laminated body such that the second bonding material layer of the laminated body is in contact with the first pad electrode, wherein the dicing tape prepared in the step of (c) further includes a protective layer provided on the third bonding material layer, and wherein the method further comprising a step of, after the step of (c) and before the step of (d), peeling the protective layer from the dicing tape.

14. The method according to claim 13,
wherein the dicing tape prepared in the step of (c) further includes:
   a base layer;
   an adhesive material layer on the base layer, the adhesive material layer being an ultraviolet curable typed adhesive material layer;
   the second bonding material layer on the adhesive material layer; and
   the third bonding material layer, and
wherein the method further comprising a step of, after the step of (e) and before the step of (f), curing the adhesive material layer of the dicing tape by an ultraviolet irradiation treatment.

15. The method according to claim 13, further comprising a step of:
   (g) after the step of (f), curing the second bonding material layer and the third bonding material layer by a heat treatment.

* * * * *